United States Patent
Enquist et al.

(10) Patent No.: US 7,126,212 B2
(45) Date of Patent: Oct. 24, 2006

(54) THREE DIMENSIONAL DEVICE INTEGRATION METHOD AND INTEGRATED DEVICE

(75) Inventors: Paul M. Enquist, Cary, NC (US); Gaius Fountain, Research Triangle Park, NC (US)

(73) Assignee: Ziptronix, Inc., Research Triangle Park, NC (US)

( * ) Notice: Subject to any disclaimer, the term of this patent is extended or adjusted under 35 U.S.C. 154(b) by 0 days.

(21) Appl. No.: 10/011,432

(22) Filed: Dec. 11, 2001

(65) Prior Publication Data

US 2002/0094661 A1 Jul. 18, 2002

Related U.S. Application Data

(63) Continuation of application No. 09/532,886, filed on Mar. 22, 2000, now Pat. No. 6,500,694, which is a continuation of application No. 09/410,054, filed on Oct. 1, 1999, now Pat. No. 6,984,571.

(51) Int. Cl.
  *H01L 29/08* (2006.01)
(52) U.S. Cl. .................. 257/684; 257/693; 257/777; 257/724; 257/E21.614; 257/E25.027
(58) Field of Classification Search .............. 257/684, 257/693, 724, 777, E21.614, E25.027
  See application file for complete search history.

(56) References Cited

U.S. PATENT DOCUMENTS

| | | |
|---|---|---|
| 3,423,823 A | 1/1969 | Ansley |
| 3,488,834 A | 1/1970 | Baird |
| 3,508,980 A | 4/1970 | Jackson, Jr. et al. |
| 3,534,467 A | 10/1970 | Sachs et al. |
| 3,579,391 A | 5/1971 | Buie |
| 3,587,166 A | 6/1971 | Alexander et al. |
| 3,602,981 A | 9/1971 | Kooi |

(Continued)

FOREIGN PATENT DOCUMENTS

EP 0 209 173 1/1987

(Continued)

OTHER PUBLICATIONS

Sun et al., "Cool Plasma Activated Surface In Silicon Wafer Direct Bonding Technology", Journal De Physique, pp. C4-79-C4-82, Sep. 1988.

(Continued)

*Primary Examiner*—George Fourson
(74) *Attorney, Agent, or Firm*—Oblon, Spivak, McClelland, Maier & Neustadt, P.C.

(57) ABSTRACT

A device integration method and integrated device. The method may include the steps of directly bonding a semiconductor device having a substrate to an element; and removing a portion of the substrate to expose a remaining portion of the semiconductor device after bonding. The element may include one of a substrate used for thermal spreading, impedance matching or for RF isolation, an antenna, and a matching network comprised of passive elements. A second thermal spreading substrate may be bonded to the remaining portion of the semiconductor device. Interconnections may be made through the first or second substrates. The method may also include bonding a plurality of semiconductor devices to an element, and the element may have recesses in which the semiconductor devices are disposed. A conductor array having a plurality of contact structures may be formed on an exposed surface of the semiconductor device, vias may be formed through the semiconductor device to device regions, and interconnection may be formed between said device regions and said contact structures.

56 Claims, 28 Drawing Sheets

U.S. PATENT DOCUMENTS

| | | | |
|---|---|---|---|
| 3,607,466 A | 9/1971 | Miyazaki | |
| 3,640,807 A | 2/1972 | Van Dijk | |
| 3,647,581 A | 3/1972 | Mash | |
| 3,888,708 A | 6/1975 | Wise et al. | |
| 4,416,054 A | 11/1983 | Thomas et al. | |
| 4,500,905 A * | 2/1985 | Shibata | 257/74 |
| 4,612,083 A | 9/1986 | Yasumoto et al. | |
| 4,617,160 A | 10/1986 | Belanger et al. | |
| 4,649,630 A | 3/1987 | Boland et al. | |
| 4,754,544 A | 7/1988 | Hanak | |
| 4,829,018 A | 5/1989 | Wahlstrom | |
| 4,962,879 A | 10/1990 | Goesele et al. | |
| 4,970,175 A | 11/1990 | Haisma et al. | |
| 4,978,421 A | 12/1990 | Bassous et al. | |
| 4,983,251 A | 1/1991 | Haisma et al. | |
| 4,992,847 A * | 2/1991 | Tuckerman | 257/623 |
| 5,024,723 A | 6/1991 | Goesele et al. | |
| 5,034,343 A | 7/1991 | Rouse et al. | |
| 5,070,026 A | 12/1991 | Greenwald et al. | |
| 5,071,792 A | 12/1991 | Van Vonno et al. | |
| 5,081,061 A | 1/1992 | Rouse et al. | |
| 5,087,585 A | 2/1992 | Hayashi | |
| 5,162,251 A | 11/1992 | Poole et al. | |
| 5,183,783 A | 2/1993 | Ohta et al. | |
| 5,196,375 A | 3/1993 | Hoshi | |
| 5,266,511 A * | 11/1993 | Takao | 438/401 |
| 5,272,104 A | 12/1993 | Schrantz et al. | |
| 5,321,301 A | 6/1994 | Sato et al. | |
| 5,324,687 A * | 6/1994 | Wojnarowski | 438/107 |
| 5,362,659 A | 11/1994 | Cartagena | |
| 5,376,579 A | 12/1994 | Annamalai | |
| 5,380,681 A | 1/1995 | Hsu | |
| 5,394,303 A * | 2/1995 | Yamaji | 361/749 |
| 5,407,856 A | 4/1995 | Quenzer et al. | |
| 5,422,302 A * | 6/1995 | Yonehara et al. | 438/153 |
| 5,427,638 A | 6/1995 | Goetz et al. | |
| 5,432,729 A | 7/1995 | Carson et al. | |
| 5,441,591 A | 8/1995 | Imthurn et al. | |
| 5,441,911 A | 8/1995 | Malhi | |
| 5,489,554 A | 2/1996 | Gates | |
| 5,514,235 A | 5/1996 | Mitani et al. | |
| 5,517,057 A * | 5/1996 | Beilstein et al. | 257/686 |
| 5,517,754 A * | 5/1996 | Beilstein et al. | 29/840 |
| 5,534,465 A | 7/1996 | Frye et al. | |
| 5,561,303 A | 10/1996 | Schrantz et al. | |
| 5,563,084 A | 10/1996 | Ramm et al. | |
| 5,567,657 A | 10/1996 | Wojnarowski et al. | |
| 5,580,407 A | 12/1996 | Haisma et al. | |
| 5,591,678 A | 1/1997 | Bendik et al. | |
| 5,650,353 A | 7/1997 | Yoshizawa et al. | |
| 5,652,436 A | 7/1997 | Stoner et al. | |
| 5,653,019 A * | 8/1997 | Bernhardt et al. | 29/840 |
| 5,661,316 A | 8/1997 | Kish, Jr. et al. | |
| 5,661,901 A * | 9/1997 | King | 29/830 |
| 5,672,240 A | 9/1997 | Stoner et al. | |
| 5,673,478 A * | 10/1997 | Beene et al. | 29/830 |
| 5,741,733 A | 4/1998 | Bertagnolli et al. | |
| 5,755,914 A | 5/1998 | Yonehara | |
| 5,760,478 A | 6/1998 | Bozso et al. | |
| 5,763,318 A | 6/1998 | Bertin et al. | |
| 5,793,115 A | 8/1998 | Zavracky et al. | |
| 5,841,197 A | 11/1998 | Adamic, Jr. | |
| 5,849,627 A | 12/1998 | Linn et al. | |
| 5,851,894 A | 12/1998 | Ramm | |
| 5,872,025 A | 2/1999 | Cronin et al. | |
| 5,877,034 A | 3/1999 | Ramm et al. | |
| 5,877,070 A | 3/1999 | Goesele et al. | |
| 5,877,516 A | 3/1999 | Mermagen et al. | |
| 5,880,010 A | 3/1999 | Davidson | |
| 5,889,302 A * | 3/1999 | Liu | 257/315 |
| 5,902,118 A | 5/1999 | Huebner | |
| 5,915,167 A | 6/1999 | Leedy | |
| 5,915,193 A | 6/1999 | Tong et al. | |
| 6,048,752 A * | 4/2000 | Linderman | 438/109 |
| 6,133,640 A | 10/2000 | Leedy | |
| 6,146,992 A * | 11/2000 | Lauterbach et al. | 438/623 |
| 6,165,817 A * | 12/2000 | Akram et al. | 438/118 |
| 6,197,663 B1 | 3/2001 | Chandross et al. | |
| 6,562,647 B1 * | 5/2003 | Zandman et al. | 438/33 |
| 2002/0181827 A1 * | 12/2002 | Johnson et al. | 385/14 |
| 2003/0020104 A1 * | 1/2003 | Talin et al. | 257/295 |
| 2003/0057423 A1 * | 3/2003 | Shimoda et al. | 257/80 |
| 2005/0110159 A1 * | 5/2005 | Oh et al. | 257/777 |

FOREIGN PATENT DOCUMENTS

| | | |
|---|---|---|
| EP | 1 130 647 | 9/2001 |
| JP | 03070155 A | 3/1991 |
| JP | 03101128 A | 4/1991 |
| WO | WO 96/13060 | 5/1996 |
| WO | WO 98/45130 | 10/1998 |
| WO | WO 01/26137 | 4/2001 |
| WO | WO 01/61743 | 8/2001 |

OTHER PUBLICATIONS

Goetz, "Generalized Reactive Bonding", Proceedings of the 1st Semiconductor Wafer Bonding Symposium, 1991, pp. 65-73.

Zucker et al., "Application of Oxygen Plasma Processing to Silicon Direct Bonding", Sensors and Actuators A, 36 (1993), pp. 227-231.

Farrens et al., "Chemical Free Room Temperature Wafer to Wafer Direct Bonding", J. Electrochem. Soc., vol. 142, No. 11, Nov. 1995, pp. 3949-3955.

Amirfeiz et al., "Formation of Silicon Structures by Plasma Activated Wafer Bonding", Proceedings of the 5th Semiconductor Wafer Bonding Symposium, Oct. 1999, 11 pages.

Nakanishi et al., "Studies on $SiO_2$—$SiO_2$ Bonding with Hydrofluoric Acid—Room Temperature and Low Stress Bonding Technique for Mems—", IEEE 1998, pp. 609-614.

"Metal Oxide Silicon Circuits on Silicon Membranes", IBM Technical Disclosure Bulletin, Oct. 1979, p. 2079.

Suzuki et al., "SiN Membrane Masks for X-Ray LIthography", Journal of Vacuum Science and Technology, vol. 20, No. 2, Feb. 1982, pp. 191-194.

Trimble et al., "Evaluation of Polycrystalline Silicon Membranes on Fused Silica for X-Ray Lithography Masks", Journal of Vacuum Science and Technology B (Microelectronics Processing Phenomena), vol. 7, No. 6, Nov./Dec. 1989, pp. 1675-1679.

Ku et al., "Low Stress Tungsten Absorber for X-Ray Masks", Microelectronic Engineering, vol. 11, No. 1-4, Apr. 1990, pp. 303-308.

"Deliberate Design for Assuring Adequate Thermal Oxide Sidewall at the Corners of Trenches", IBM Technical Disclosure Bulletin, Jul. 1991, pp. 261-262.

"Wafer Bonding With Stress-Free Trench Isolation", IBM Technical Disclosure Bulletin, Jul. 1991, pp. 304-305.

* cited by examiner

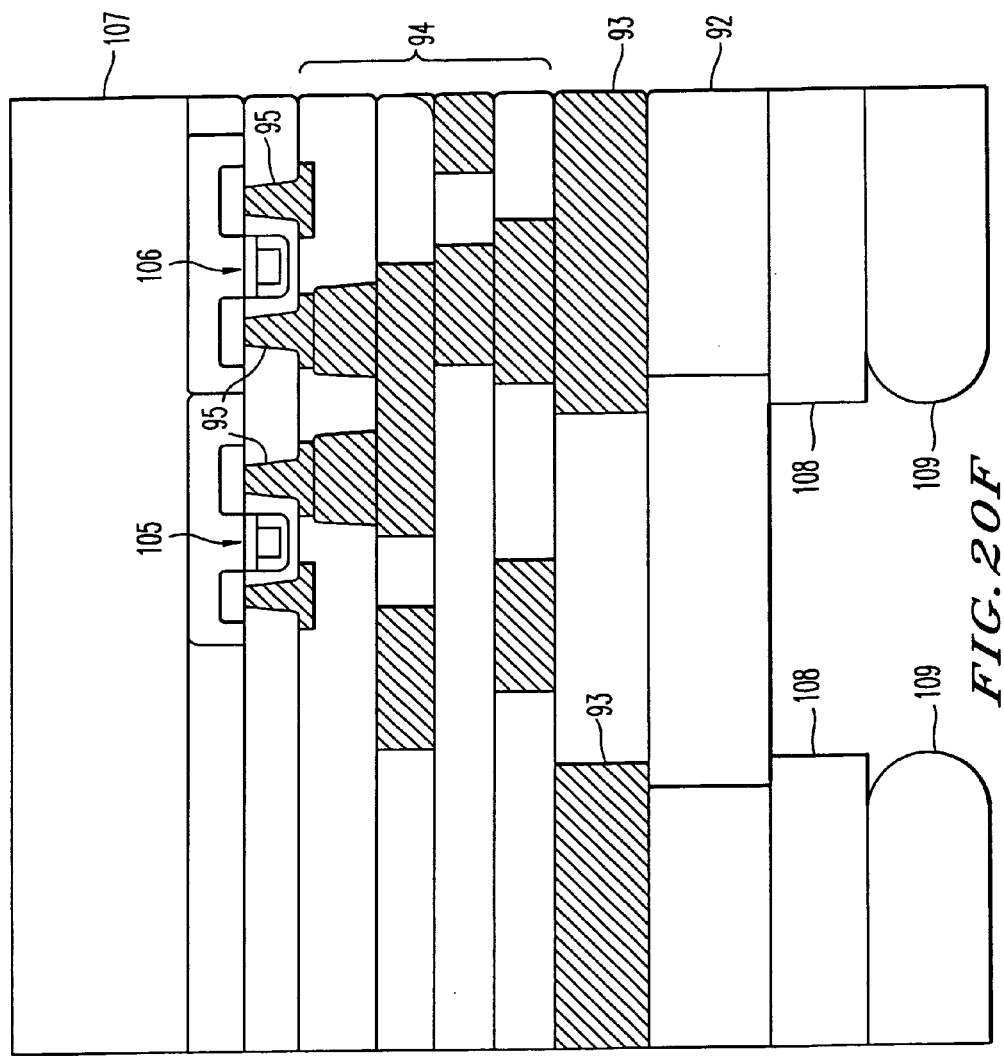

THREE DIMENSIONAL DEVICE INTEGRATION METHOD AND INTEGRATED DEVICE

This application is a continuation of application Ser. No. 09/532,886, filed on Mar. 22, 2000 and of application Ser. No. 09/410,054, filed on Oct. 1, 1999.

BACKGROUND OF THE INVENTION

1. Field of the Invention

The present invention relates to three-dimensionally integrated semiconductor devices and, in particular, to semiconductor devices vertically bonded together to form three-dimensional structures.

2. Discussion of the Background

The ability to integrate determines the success of the semiconductor industry. This was first demonstrated with the invention of the integrated circuit (IC). The IC essentially consists of fabrication of electronic components at the surface of the semiconductor wafer followed by interconnection of these components with metalization on top of the components. The dramatic reduction in cost and increase in performance that has resulted from this integration has had a profound economic impact.

Since the invention of the IC, the semiconductor industry has experienced continued rapid growth due to continuous improvements in the integration density of various electronic components (i.e., transistors, diodes, resistors, capacitors, etc.) achieved. For the most part, this improvement in integration density has come from repeated reduction in minimum feature size which allow more components to be integrated in a given area. Additional improvement has come from increases in wafer size.

These integration improvements are essentially two-dimensional (2-D) in nature, in that the volume occupied by the integrated components is essentially at the surface of semiconductor wafer. Although dramatic improvements in lithography have resulted in considerable improvement in this 2-D integration, there are physical limits to the density which can be achieved in 2-D. One of these limits is simply the minimum size needed to make these components. Another limit is the significant increase in interconnect requirements between components as the component size is reduced.

Efforts to achieve integration beyond that available with 2-D has been explored and resulted in improvement in chip memory and further semiconductor industry growth. For instance, the trench capacitor uses significant semiconductor volume below the wafer surface and allows more functionality to be achieve in a given chip area. Other efforts, directed at achieving higher levels of integration by increased use of the volume in a given chip area, have recently increased. One approach has been to iterate the integration process by adding semiconductor material on top of the interconnect metalization followed by additional interconnect metalization. Although this potentially results in more components per chip area, it suffers from other problems including significantly increased thermal budgets. In addition, this and other efforts are distinct in that they only use one substrate and then work on one surface of that substrate. Not subjecting the devices to the thermal processes involved in fabricating the interconnect would simplify and enhance the fabrication of the devices.

Another problem results from the lagging of the ability to scale interconnect dimensions compared to scaling device dimensions. Ideally, one wants the critical dimension of a via to be the same as a gate dimension. However, since the scaling of vias lags the scaling of devices, integration density is limited.

Further problems arise when trying to integrate different types of technologies into a single circuit or wafer. BiCMOS is one example. Typically, special processing techniques must be devised to be able to combine the technologies. Processes required for one technology often interfere with processes required for another. As a result, compromises are made. The overall development of the combined technology becomes frozen in time, making flexible integration of the technologies that are being combined very difficult if not impossible. In other words, the most advanced "best of breed" technologies are not combined and evolutions in the technologies cannot be exploited.

Another problem of combining technologies is that customization must occur up front. One must first design the processing to combine the technologies and thus the limitations are built into the device. Again, one cannot easily take advantage of evolutions and improvements in technology since that requires redesigning the processing.

SUMMARY OF THE INVENTION

It is an object of the present invention to provide a method and device having high integration density.

It is another object of the invention to provide a method and device where different types of materials may be integrated.

It is a further object of the present invention to provide a method of integrating different types of devices, and a structure comprising the integrated devices.

It is yet another object of the invention to provide a method and device where different types of technologies are integrated.

It is a still further object of the invention to avoid or minimize the thermal budgets in interconnecting devices.

It is yet another object of the invention to allow the integration of the best available technologies without making significant processing compromises.

A still further object is to provide improved interconnection of bonded devices, and between devices and boards, cards and/or substrates.

These and other objects may be obtained by a method of forming an integrated device including the steps of forming a first bonding material on a first semiconductor device having a first substrate, forming a second bonding material on a first element having a second substrate and directly bonding the first and second bonding materials. A portion of the first substrate may be removed to expose a remaining portion of the first semiconductor device, and the integrated device may be mounted in a package.

The first semiconductor device may be connected to the package from an exposed side of the remaining portion of the first semiconductor device. The first semiconductor device may have a substrate with top and bottom sides, with an active area being formed in the top side, and the package may be connected to the first semiconductor device from the bottom side. A second element having a third substrate may be bonded to the remaining portion of the first semiconductor device, the first element may be removed or substantially removed and the semiconductor device may be connected to the package from the top side.

The first semiconductor device may have a plurality of levels of interconnect, and connections may be formed to at least one of the levels of interconnect from an exposed remaining portion side. A plurality of levels of interconnect may also be formed from an exposed remaining portion side. A connection may be made directly to a device element region of the first semiconductor device.

The method according to the invention may also include steps of bonding a first thermal spreading substrate to a first semiconductor device having a device substrate, removing a portion of the device substrate to expose a remaining portion of the first semiconductor device, and bonding a second thermal spreading substrate to the remaining portion of the first semiconductor. A plurality of levels of interconnect may be formed in the first semiconductor device, and connections to at least one of these levels of interconnect may be made using the first or second thermal spreading substrates. The connections to the levels of interconnect may be formed using an areal contacting method and connections may be made directly to device element regions of the semiconductor device.

The method according to the invention may also include steps of directly bonding a first semiconductor device having a first substrate to an element, removing a portion of the first substrate to expose a remaining portion of the first semiconductor device after bonding, wherein the element may comprise one of a substrate used for thermal spreading, impedance matching or for RF isolation, an antenna and a matching network comprised of passive elements. The remaining portion of the first semiconductor device may be interconnected with the element and a portion of the remaining portion may be removed to expose a portion of the element.

The method according to the invention may also include directly bonding a first component of a system to a second component of the system, and interconnecting the first and second components. The first component may be bonded to a second component having a substrate, at least a portion of the substrate may be removed and the first and second components may be interconnected from the side of the second component from which the portion has been removed. A shielding member, an isolation member or an antenna may be bonded to at least one of the first and second components. The antenna may also be interconnected with at least one of the first and second components. An optical device may be bonded to an electrical device, or a lower-speed higher-density semiconductor device may be bonded to a higher-speed lower-density semiconductor device. The first and second semiconductor devices may be of different technologies. As an example, a microprocessor may be bonded to a high density memory device or, as another example, first and second solar cells may be bonded together.

The method according to the invention may also include attaching a plurality of first elements to a surface of a substrate to form a second element, and directly bonding the second element, from a side to which the first elements are attached, to a third element. The attaching step may comprise directly bonding each of the plurality of first elements to a surface of the substrate. A portion of the second element may be removed after bonding. The first elements may be interconnected with the third element, the first elements may be interconnected using the second element, and the first elements and third element may be interconnecting using at least one of the second and third elements. Recesses may be formed in the second element, and the first elements may be bonded to the second element in the recesses.

As a further embodiment, a method may include steps of forming a first bonding material on a first semiconductor device and forming a second bonding material on a second element. The first and second bonding materials may be directly bonded, and a conductor array may be formed having a plurality of contact structures on an exposed surface of the first semiconductor device. Vias may be formed through the first semiconductor device to the device regions, and interconnections may be formed between the device regions and the contract structures. The conductor array may comprise a pin grid array. The method may further include mating the pin grid array with conductive regions formed on one of a board, card and substrate.

The device according to the invention may include a first device portion comprised of a first device having a first substrate from which the first substrate have been removed, a first bonding material formed on the first device portion, a first element having a second bonding material formed thereon, with the first bonding material directly bonded to the second bonding material. The first device portion may comprise a first solar cell portion and the first element may comprise a second solar cell with a substrate. Interconnections may be formed between the first solar cell portion and the second solar cell from a side of the first solar cell portion from which the first substrate is removed.

The first device portion may comprise a semiconductor device having active elements and the first element may comprise one of a substrate used for thermal spreading, impedance matching or for RF isolation, an antenna, and a matching network comprised of passive elements. The first device portion may have a first side an opposing second side, an interconnections may be made to the device portion from either the first side or the second side. A shielding member or an isolation member may be directly bonded to one of the first device portion and the first element. An antenna may be directly bonded to one of the first device portion and the first device element and interconnections may be made between the antenna and at least one of the first device portion and the first element.

The first device portion may comprise an optical device and the first element may comprise an electrical device. The first element may also comprise a lower-speed higher-density semiconductor device and the first device portion may comprise a higher-speed lower-density semiconductor device.

The integrated device according to the invention may also include a plurality of first elements each directly bonded to a surface of a substrate, to form a second element, and a third element directly bonded to the second element from a side on which the first elements are bonded to the surface of the substrate. Interconnections may be made between the third element and selected ones of the plurality of first elements, and interconnections may be formed between selected ones of the first elements. The first elements may be disposed in recesses formed in the substrate.

As another embodiment, the device according to the invention may include a device portion containing semiconductor devices having opposing top and bottom sides, a first substrate directly bonded to the top side of the device portion and a second substrate directly bonded to the bottom side of the device portions. Interconnections may be formed to the device portions through either or both of the first and second substrates. Power and ground connections may be formed to the device portions through only one of the first and second device substrates, and signal and clock interconnections may be formed to the device portions through the other of the first and second substrates.

The integrated device according to the invention may also include a plurality of first elements each directly bonded to a surface of a second element. The first elements and the second element may include at least one of semiconductor devices, patterned conductors, antenna elements and impedance matching elements. Vias may be formed in the first elements, and conductive material may be formed in the vias to interconnect the first elements with the second element.

The device according to the invention may also include a first bonding material disposed on a first semiconductor device and a second bonding material disposed on a first element. The first and second bonding materials are directly bonded. A conductive array may be disposed on a exposed surface of the first element having a plurality of conductive regions, and interconnections may be formed between the conductive regions of the array and conductive regions of the semiconductor device. The conductive array may comprise a pin grid array. The second conductive regions may be mated with conductive regions formed on at least one of a board, card and substrate.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIGS. 20A–20F are diagrams illustrating the integration method according to the invention;

DESCRIPTION OF THE PREFERRED EMBODIMENTS

Figure 1:
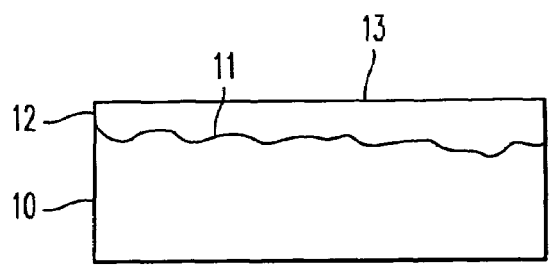
FIG. 1 is a sectional diagram illustrating a step in the method according to the invention.

Referring now to the drawings, and more particularly to FIG. 1 which illustrates a first embodiment of the method and device according to the invention. A substrate 10 has a upper surface 11 having a surface planarity. Substrate 10 preferably is a surrogate substrate or an integrated circuit wafer. The non-planarity of surface 11 shown in FIG. 1 is for illustrative purposes and is not meant to depict exact surface planarity conditions. Substrate 10 preferably has a relatively smooth and planar surface 11. The desired smoothness and planarity of the upper surface may be achieved through polishing. Chemical-mechanical polishing or CMP is one manner of achieving the desired smoothness and planarity. The CMP process is optimized with appropriate selection of polishing pads, polishing slurries and polishing conditions to obtain the desired surface roughness and planarity.

On surface 11 is deposited a film 12 having a thickness greater than the surface non-planarity of surface 11. Film 12 should have good thermal conductivity and a high dielectric constant, such as $SiO_2$, diamond or diamond-like carbon (DLC). Thermal conductivities in the range of 1–10 W/cmK and relative dielectric constants in the range of 1–3 are preferable. A preferable range of thickness for film 11 is from 1–10 times the surface non-planarity of film 11. The upper surface 13 of film 13 is then polished to a planar surface with a roughness of 5–15 Å and preferably between 5–10 Å. A planar surface with a roughness of 5 Å is most preferred as a smoother planar surface will enhance the bonding properties of the film.

Figure 2:
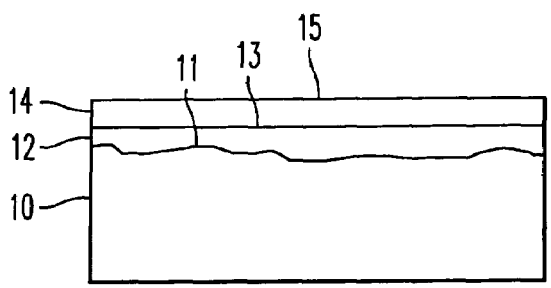
FIG. 2 is a sectional diagram illustrating a step in the method according to the invention.

It is also possible to deposit film 12, polish upper surface 13, and then deposit another film (14 in FIG. 2), and polish the second film, to achieve the desired smoothness of the upper surface (15 in FIG. 2). Three or more films, repeating the depositing and polishing operations for each or for at least the upper film, may be used to achieve the desired surface roughness and planarity.

Figure 3:
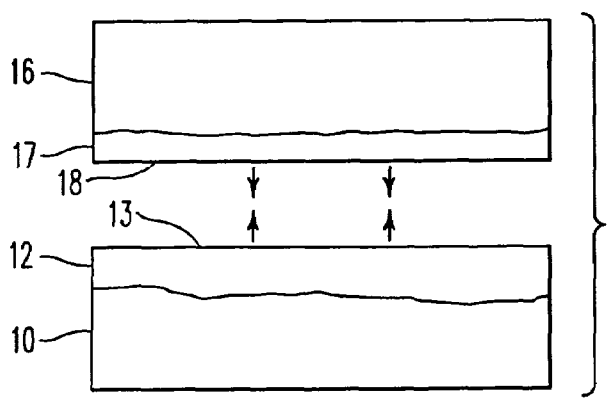
FIG. 3 is a sectional diagram illustrating bonding two substrates according to the invention.
Figure 4:
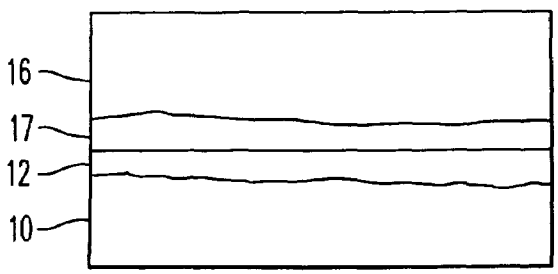
FIG. 4 is a sectional diagram a bonded device according to the invention.

The substrate 10 is now ready for wafer bonding. Any type of substrate may be bonded to substrate 10. Referring to FIG. 3, a substrate 16, preferably an integrated circuit wafer containing active devices, is prepared in the same manner as substrate 10 by forming a film 17 having an exposed surface 18 with a surface roughness in the same range as surface 13 of film 12 (or surface 15 of film 14). A higher degree of planarity will further facilitate the bonding process. Film 17 may be formed of one or more layers with one or more polishing operations, as described above. Surfaces 18 and 12 are brought into contact with each other (shown by the arrows in FIG. 3). A bond between surfaces 18 and 13 is formed (FIG. 4). With combinations of flattening, smoothing, cleaning, activating and passivating surfaces, a strong bond such as covalent maybe formed. Initially, a part of the surfaces are brought into contact, initiating a weaker bond, such as a Van der Waals bond. The stronger bond then can form. Activation may be done through dry or wet processing, ion implantation, or a combination thereof. A stronger bond can be achieved by subsequently heating the joined substrates and films.

This provides the preferred manner of bonding which is direct bonding without the use of applied pressure, voltage or heating. Bonding in ambient temperature and pressure is preferred. The bonding also is preferably performed by bringing the bonding surfaces in contact with each other, without applied pressure, voltage or heating, or the use of adhesives or molding material. It the substrate has an upper surface of $SiO_2$ (or other bonding material), one can polish that surface without depositing another $SiO_2$ layer, assuming that the upper surface of $SiO_2$ has sufficient thickness to obtain a sufficient surface roughness and planarity with, e.g., CMP.

EXAMPLE

This example uses the case of attachment of a diamond substrate to a material such as GaAs, InP, or GaN when optimal thermal packaging and dielectric performance are desired. Bonding to a substrate of a material having a high thermal conductivity allows one to better manage thermal transfer. The diamond substrate, after preparing it for bonding, has a relatively smooth upper surface. As diamond substrates typically have a relatively rough surface, a relatively smooth and planar upper surface may be obtained by polishing. Polishing may be expensive and difficult to consistently obtain very smooth surfaces. It is also possible to form the diamond substrate on a copper susceptor. Diamond films typically "pop-off" the copper susceptor after deposition as the temperature is lowered, leaving a relatively smooth and planar surface where growth initiated and a rougher surface where growth terminated.

On top of the upper surface is deposited a thin layer of silicon dioxide. The silicon dioxide layer should be thicker than the non-planarity of the diamond surface, e.g., 1–10 times, but as thin as possible to optimize performance. The silicon dioxide layer is then polished to a smooth surface suitable for wafer bonding, for example, 5 Å. The diamond substrate having the thin silicon layer is now ready for wafer bonding.

Figure 5:
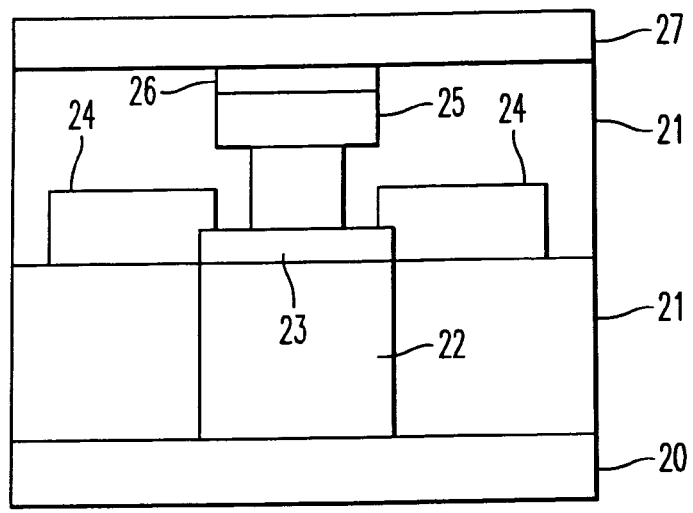
FIG. 5 is a sectional diagram of a heterojunction bipolar transistor.

At this point any type of device formed on any type of substrate may be bonded to the surface of silicon dioxide layer. For this example, a heterojunction bipolar transistor (HBT), as described in application Ser. No. 09/165,203, the disclosure of which is incorporated herein by reference, may be used. The HBT is processed to the point where it is ready for attachment of a surrogate substrate, as shown in FIG. 5. Typically, this would include the steps of forming the emitter metalization, performing base etching, applying base metalization, applying a passivation/planarization level and applying a thermal shunt. In FIG. 5 there is collector layer 22 formed on a GaAs substrate 20, planarizing material 21, base region 23, base contacts 24, emitter 25 and emitter contact 26. It should be noted that FIG. 5, while illustrating a single device, is not so limited. A wafer containing a number of devices or an integrated circuit may also be bonded in the same manner.

On top of the planarized surface of the HBT is deposited another very thin layer of silicon dioxide 27. The thickness of silicon dioxide layer 27 is thicker than the non-planarity of the planarized surface of the HBT (e.g., 1–10 times) but as thin as possible to optimize performance. The surface of the silicon dioxide layer 27 is polished to a smoothness sufficient for wafer bonding, for example 5 Å. Layers 27 and 12 are then bonded by placing them in close proximity. The surfaces are preferably placed in close proximity after a wet cleaning process, followed by a drying operation to force the liquid from between the layers 27 and 12. A Van der Waals bond is formed. A stronger bond can be achieved by subsequently heating joined layers 27 and 12.

Figure 6:
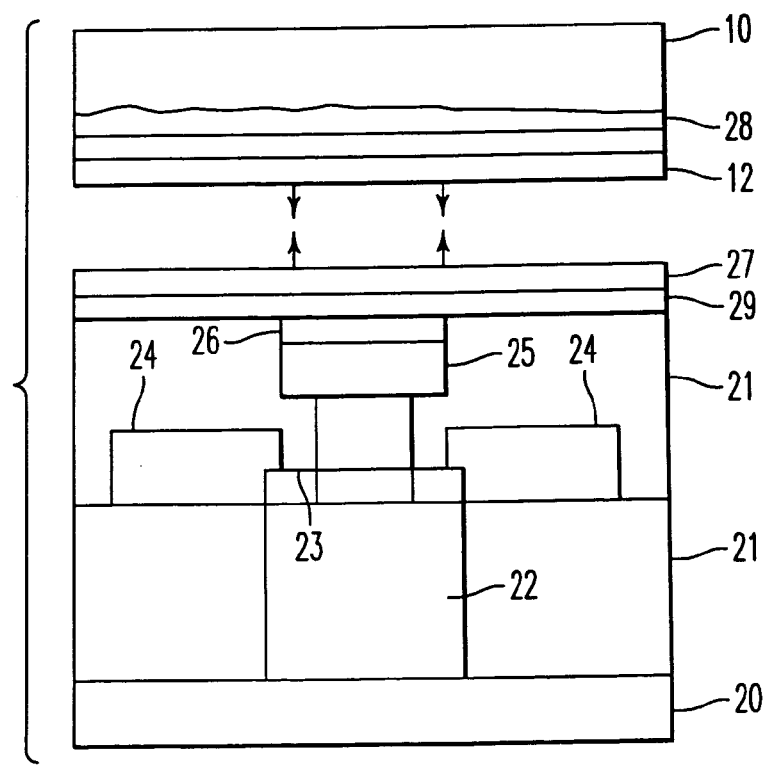
FIG. 6 is a sectional diagram illustrating bonding the transistor of FIG. 4 according to the invention.

When layers 12 and 27 are heated after joining, stress may be generated which lead to some deleterious effects in the formed device and surrogate substrate. It is possible to form a stress-relieving layer between the diamond substrate and silicon dioxide layer and between the HBT device and silicon dioxide layer 27. This is illustrated as films 28 and 29 in FIG. 6. The stress relieving layer is a homogeneous or composite layer with material, i.e., Young's modulus, such that this layer will yield the application of stress before other layers.

While the bonding has been described using a silicon dioxide film polished to a desired surface roughness, other films are possible. For example, silicon or DLC may also be used. In the case of silicon, oxygen may be implanted into the bonding layers below their respective surfaces to form a compliant layer. The compliant layer is a layer equivalent to the stress-relieving layer. One would prefer to use a Si, SiC or DLC film versus an $SiO_2$ film, when, for example, improved thermal conductivity is desired.

It is also possible to choose the passivation/planarization material in the device being bonded to optimize the dielectric constant, thermal conductivity and resistivity adjacent to the active device. In particular, DLC is effective due to its relatively high thermal conductivity and low dielectric constant compared to other materials.

As shown in FIG. 5, the HBT device 14 typically is formed on substrate 20. After bonding the device to substrate 10, substrate 20 can be removed through a process such as polishing, or grinding and polishing, allowing access to backside contacts.

Figure 7:
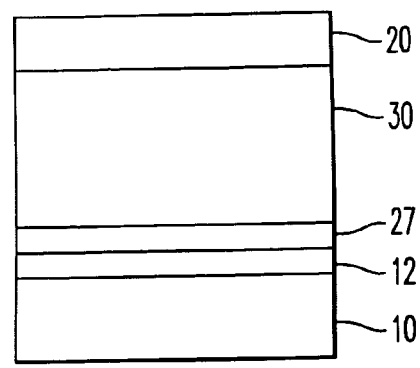
FIG. 7 is a sectional diagram of a bonded device according to the invention.
Figure 8:
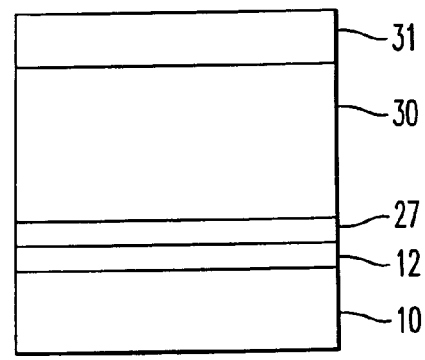
FIG. 8 is a sectional diagram illustrating a step in bonding together two devices according to the invention.

In a second embodiment of the invention, N 2D arrays of devices are bonded together by repeating the method described in the first embodiment N times. Starting with the bonded device shown in FIG. 7 (the HBT device is shown without the component detail as 30), the substrate 20 is removed and the exposed surface of device 30 is polished, if necessary, to a level of smoothness advantageous for wafer bonding. Polishing and grinding may be used during the removal of substrate 20. Another layer of silicon dioxide 31 is deposited on the exposed surface of device 30 and polished to the desired surface roughness, in a manner as described above for layers 12 or 27 (FIG. 8).

Figure 9:
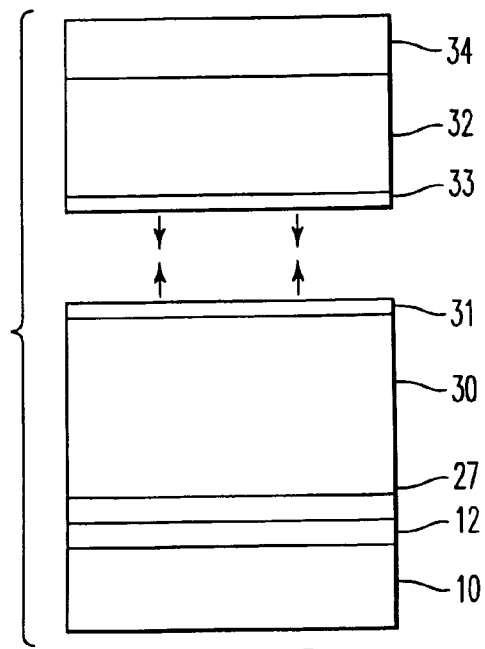
FIG. 9 is a sectional diagram illustrating a step in bonding together two devices according to the invention.
Figure 10:
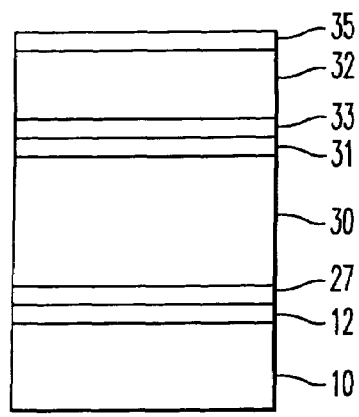
FIG. 10 is a sectional diagram illustrating two devices bonded according to the invention.

A next wafer, shown without the device details as 32 with substrate 34 in FIG. 9 has a thin layer of silicon dioxide 33 formed on the surface opposite substrate 34. Film 33 is formed and polished in the same manner as films 11, 27 and 31. Film 33 is then bonded to the exposed surface of layer 31. The resulting device is shown in FIG. 10, after removal of the substrate 34. The upper surface of the second bonded device may again be polished, another silicon dioxide layer 35 deposited in preparation for bonding of a third device. This can be N times to produce an N-integrated device. The devices so bonded may be interconnected vertically.

EXAMPLE

An example of the bonding between multiple devices is shown in FIGS. 11A, 11B and 12–15. FIGS. 11A, 11B and 12–15 illustrate how the bonding according to the present invention can be used to integrate N 2D arrays of devices, how they can be interconnected to form a vertically-integrated multi-wafer module, and how different technologies may be joined.

Figure 11A:
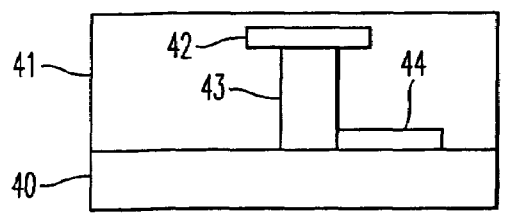
FIGS. 11A and 11B are sectional diagrams of two devices to be bonded according to the invention.
Figure 11B:
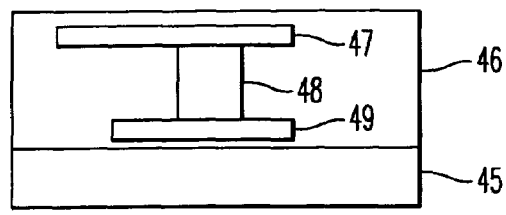
Figure 12:
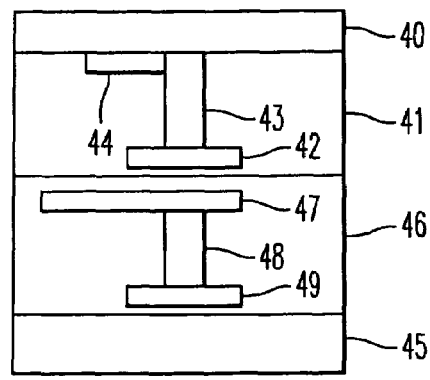
FIG. 12 is a sectional diagram illustrating bonding of the devices of FIGS. 11A and 11B.

FIGS. 11A and 11B illustrate two devices to be bonded. In this example, the devices of FIGS. 11A and 11B are dissimilar integrated circuit wafers having interconnections. In FIG. 11A a symmetric-intrinsic HBT (SIHBT) wafer contains an SIHBT surrogate substrate 40, plananzing material 41 formed on substrate 40, SIHBT device 43 and interconnects 42 and 44, preferably formed of a metal. FIG. 11B illustrates a VCSEL device having a VCSEL substrate 45, planarizing material 46, VCSEL device 48 and interconnects 47 and 49, again preferably formed of metal. As shown in FIG. 12, the devices of FIGS. 11A and 11B are bonded in the method as described above, that is, a material such as silicon dioxide is deposited on the upper surface of each device and then polished to a surface roughness of about 5–10 Å. A high degree of planarity is also desirable. The bonded devices are shown in FIG. 12.

Figure 13:
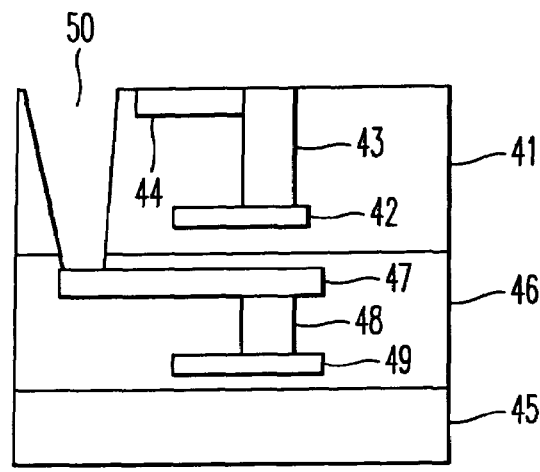
FIG. 13 is a sectional diagram illustrating a step of interconnecting the devices of FIGS. 11A and 11B.

Next, as illustrated in FIG. 13, substrate 40 is removed exposing interconnect 44. A via hole 50 is etched through planarizing material 41 and into planarizing material 46 to expose a portion of interconnect 47. While one via hole 50 is shown, it is to be understood that any number of vias may be formed in order to make the appropriate connection(s) to the devices in the two bonded substrates.

Interconnect 51 is formed in via hole 50 interconnecting the devices 43 and 48. At this point the process could be stopped if only two wafers were required to be bonded. If one or more devices need to be further integrated, the process may continue by forming a bonding layer 52 made of, for example, silicon dioxide, which is then polished to a surface roughness of 5–10 Å in the same manner as described above. In this case, the process may include a step of filling any cavity formed in interconnect 50 to more easily produce a smooth surface of layer 52. The device, as shown in FIG. 14 is now ready to be bonded with another wafer, if desired.

For the wafers of different technologies, the planarizing material may be the same. The two different technologies that are separated by the layers of planarizing material do not interact. Each only interacts with the planarizing material. Since the properties of the planarizing material are both well known and are commonly used in current processes, no new materials are needed to combine the technologies. The invention provides a very manufacturable manner of combining different technologies.

Moreover, all of the customization takes place at the end of the processing. Both wafers are separately manufactured and then bonded. The interconnection is performed after the bonding. Customization of combined technologies takes place at the end of the process. Whatever technology one needs may be obtained, and these technologies may be those that are readily and commercially available. The need for designing a new process is eliminated. More control over the final combined product is possible as well-defined and devices fabricated with a stable process may be selected for combining, unlike a new, unqualified combined process where little manufacturing, reliability or longer term information is available.

Figure 14:
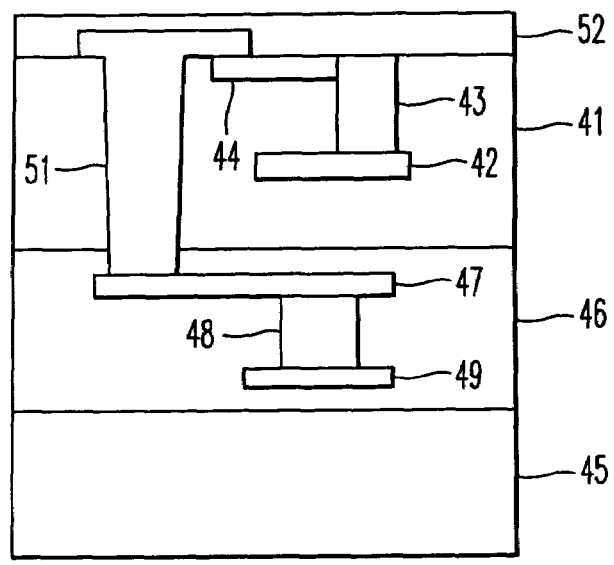
FIG. 14 is a sectional diagram illustrating a step of bonding the bonded devices of FIGS. 11A and 11B to another device.
Figure 15:
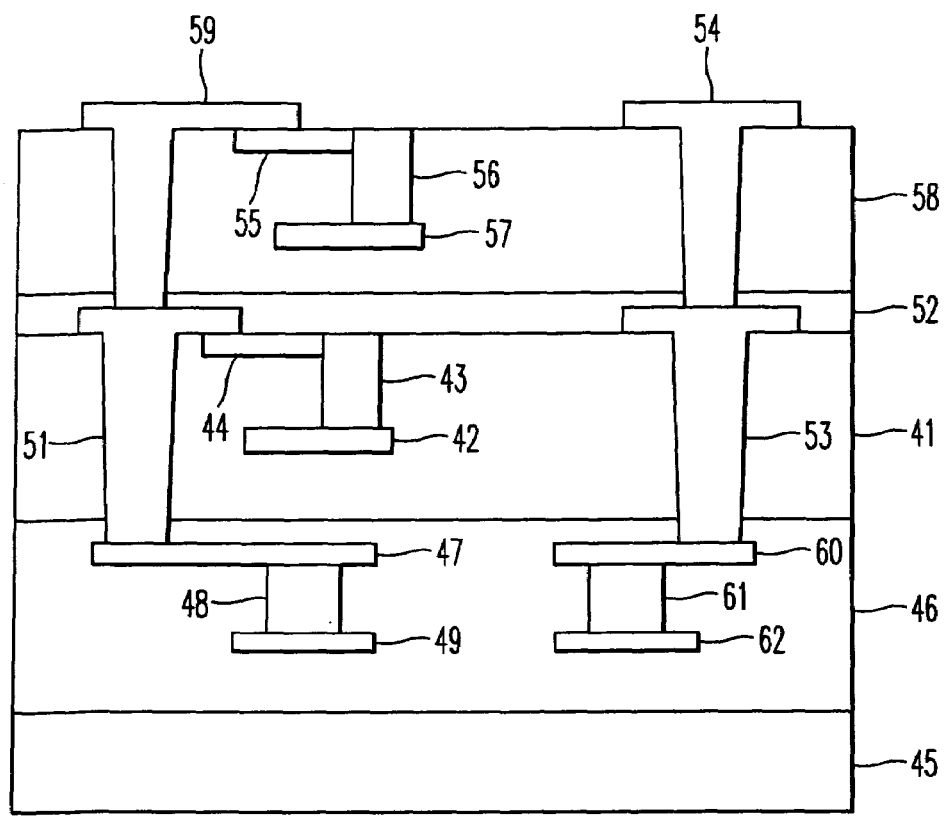
FIG. 15 is a sectional diagram illustrating bonding and interconnecting three devices.

The bonding of a third wafer to the structure of FIG. 14 is illustrated in FIG. 15. It is noted that FIG. 15 illustrates an additional metalization 53 formed by etching planarizing material 41 and 46 to expose a portion of interconnect 60 of another device having elements 60–62. Interconnect 53 has an extended portion on the surface of planarizing material 41 to facilitate interconnection on another level. The device in the third wafer in this case can be a CMOS device 56 having interconnects 55 and 57. Another via is etched through planarizing material 58 and through bonding material 52, exposing a portion of interconnect 51 to allow connection with interconnect 59. Interconnect 59 is also connected with interconnect 55 of CMOS device 56. Another interconnect 54 is formed by etching a via through materials 58 and 52 to expose a portion of interconnect 53. An interconnect 54 is formed to contact interconnect 53. It should be noted that FIG. 15 does not explicitly show the bonding layers formed between the devices but is to be understood that these are the devices that are formed using the process described above in connection with the first embodiment.

What is also apparent from FIG. 15 is that the present invention utilizes both sides of a contact. For example, if the pad at the top of contact 51 is a contact pad or a metal line, then the bottom surface of the pad (or line) is connected with interconnect 47 lying under the pad (or line) while the top of the pad (or line) is connected with contact 59 overlapping with interconnect 55. This can reduce drive requirements.

FIG. 15 also illustrates the advantage of the invention of not being constrained to one layer (or possibly two layers) for circuit topography. One has the ability to design three dimensionally. Circuit layouts can be optimized if one is given the ability to separate a type or class of device from others where either the functioning or processing interferes or is incompatible. Circuit layouts are minimized in area since three dimensions are used instead of only two. For example, three conventional chips of nominally the same area with optionally different technologies can be implemented in one third the area by stacking vertically. The area reduction is even greater if one considers the reduced packaging requirements of the individual chips vs. the stacked chips. Stacking vertically is also conducive to the insertion of ground, bias, or other planes between chips or within a chip for improved signal isolation during routing.

Typically, in a system signals are amplified and then transmitted over buses between integrated circuits. This requires a lot of level-shifting, buses and compensation for various differences in signal levels amongst the elements making up the system. As one example, a pixel in a light detecting device receives a very small packet of charge which is then shifted out of the device and into a memory device. The light detecting device and the memory in this case may both be separate integrated circuits, requiring amplification of the charge packet through buffers and system buses between the pixel and memory device. The signal levels are then shifted down in order to store the information in a memory cell in the memory device. When the information in the memory is needed to be processed, the information is then level-shifted again using more buffers and system buses to transmit the data over to a processor, which also may be formed using a separate integrated circuit. The power levels for the various signals are determined by the interconnection and the buses.

Figure 16B:
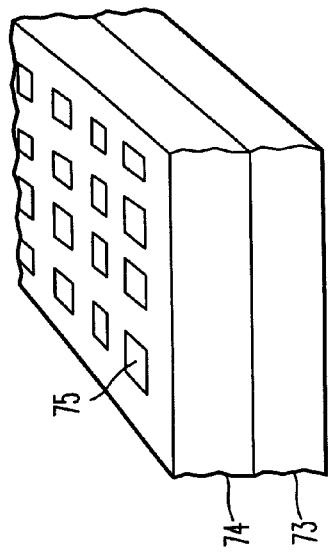
FIGS. 16A–16D are diagrams illustrating bonding three integrated circuits.
Figure 16D:
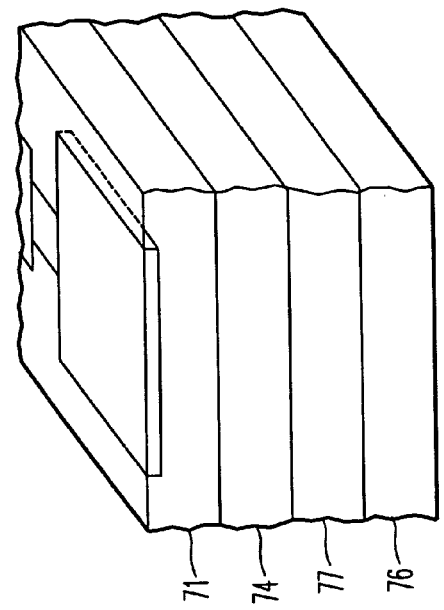
Figure 16A:
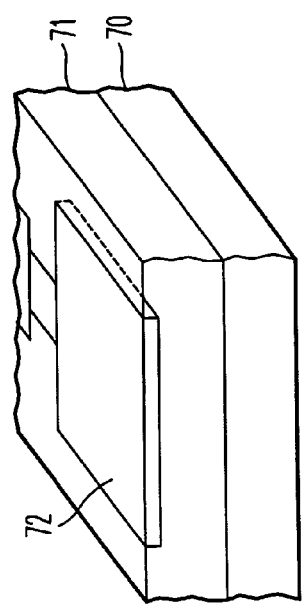

The present invention allows one to obtain element-to-element communication and addressability. In the present, the power levels of signals may be determined by the element, and not the interconnect, i.e., the system buses and drivers. As an example, as shown in FIG. 16A–16D, a first integrated circuit consisting of an array of pixels for sensing a light signal, etc. is fabricated on a first substrate (FIG. 16A). In simplified fashion, a pixel 72 is formed in a semiconductor layer 71, which is formed on a substrate 70. On a second substrate is fabricated the memory device needed to store the information when it is shifted out of the pixel array, and is shown in FIG. 16B. A semiconductor layer 74 is formed on a substrate 73. Memory cells 75 are formed in layer 74. Lastly, a processor device for processing the information is manufactured on a third substrate shown in FIG. 16C. Various elements 78 are shown (in simplified form) in layer 77 formed on substrate 76. Each of the substrates may then be bonded together (with the pixel array on top in order to expose it to the light).

The three substrates may be bonded together. A surrogate substrate (not shown) may be attached to an upper surface of layer 71 using the techniques described above, and substrate 70 removed. The upper surface of layer 74 of the memory device is then bonded to the surface exposed by removing substrate 70. Substrate 73 may then be removed, and the upper surface of layer 77 is bonded to the surface exposed by removing substrate 73. The surrogate substrate may be removed to expose the pixels 72. The interconnections may be made directly between the three substrates, in the manner discussed above, eliminating the need for the numerous buffers and system buses required to interconnect the system when the system is designed using separate integrated devices. The bonded circuit is shown in FIG. 16D. It should be noted that FIG. 16D does not illustrate the various layers used to bond the different devices, and that portions of the layers 71, 74, and 77 may be removed during the removal of the corresponding substrates, as desired.

Another example would be a typical microprocessor where the microprocessor contains a certain amount of on-board ROM while a larger amount of storage is accessed via system buses on a separate RAM. In this case, the processor with the on-board ROM may be fabricated on a first substrate and the memory may be fabricated on a second substrate. The two substrates are to be bonded together and the processor directly bonded to the memory device, again eliminating the need for system buses, level shifters and other buffers.

The present invention not only allows the fabrication of systems in a more compact and directly accessible manner, but also allows a smaller footprint. Each of the separate devices described above would take up at least three times the amount of space compared to the present invention they are stacked upon each other, assuming chips of about the same size.

A fourth embodiment of the invention uses the techniques described above to create the interconnect separately from the underlying integrated circuit. Typically, circuits require a number of levels of interconnect in order to provide all the complex functions required. Six or more levels of interconnect may be needed. This requires a significant amount of thermal processing, exposing the underlying active devices to higher thermal budgets and complicating the fabricating process. The present invention may be used to fabricate the active devices separately and then forming layers of interconnect by bonding according to the present invention. In particular, each level of interconnect may be formed on separate substrates, then bonded together and interconnected as needed. Several or all of the interconnect layers may be fabricated at one time. The bonded together or single interconnected substrate may then be bonded to the substrate having the active devices. Techniques similar to those described above for interconnecting the different wafers shown in FIG. 15 may be employed. When finished, the stack of interconnected layers may be bonded to the active devices.

Figure 16C:
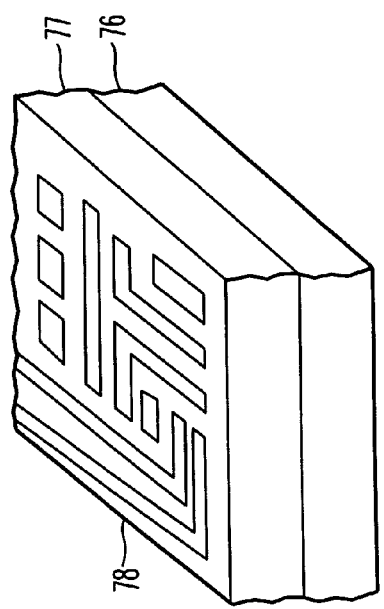
Figure 17A:
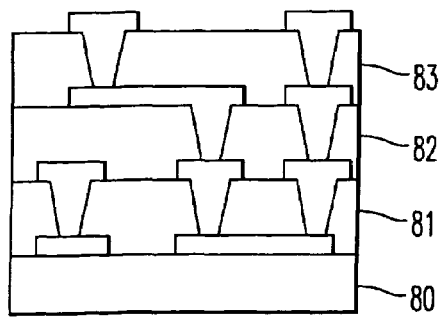
FIG. 17A is a diagram of a layered interconnect structure.
Figure 17B:
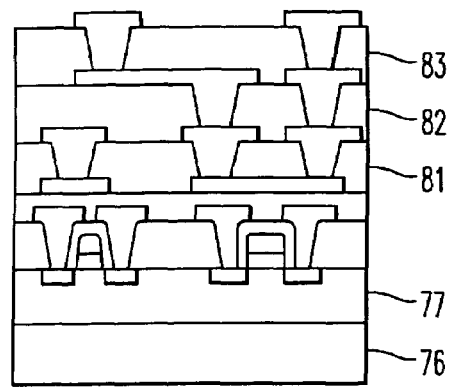
FIG. 17B is a diagram of bonding the layered interconnect structure of FIG. 17A to an substrate having integrated circuits.

This is illustrated in FIGS. 17A and 17B, where a stack of interconnect having layers 80–83 is bonded according to the principles of the invention and shown in FIG. 17A is then bonded to the integrated circuit shown in FIG. 16B or 16C. FIG. 17B shows the completed device with the layers used in the bonding process omitted for clarity. In this case, the substrate of the integrated circuit may be removed and bonded to a more favorable thermal material, such as diamond-like carbon. With this embodiment, one can obtain tighter processing control by not having to compensate or make compromises for the various effects of the increased thermal budget due to the typical processing of the multiple layers of integrated circuit interconnection on top of the active devices.

Another application of the invention is the selection of the interconnect layers. By being able to separately process the interconnect, more design flexibility may by obtained. Certain layers, for example those handling high speed signals, may be more critical than others. The critical levels may be separated from each other by other non-critical layers to minimize overlap. Conversely, non-critical layers may be put in adjacent layers when the overlap is not a problem for high speed operation of the device.

Figure 18:
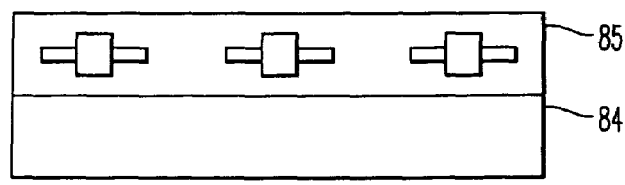
FIG. 18 is a diagram of a 2-D array of circuit elements.

Apparent from the above embodiments, the substrate of the integrated circuits may be completely removed in the above embodiments. The result is a 2-D array of device elements immersed in insulative planarizing material. One example of this is shown in FIG. 18. Each of the elements may be completely isolated from every other element, i.e., a 2-D array of devices as opposed to a circuit layer. A second wafer to be bonded may be processed in the same way, giving another 2-D array of device elements. The arrays of devices may then be interconnected in a desired manner to create circuits, subcircuits, etc. This can be extended to bonding different technologies together, for example, CMOS and bipolar, to create a BiCMOS wafer. In this case the most advanced CMOS and bipolar technologies may be combined since the two wafers are separately processed. One can then, when needing to create a combined technology device or circuit, use existing advanced, qualified technologies rather than having to design a new combined process or settle for an existing combined technology which does not use and cannot take advantage of the most advanced technologies or evolutions in technologies.

Figure 19:
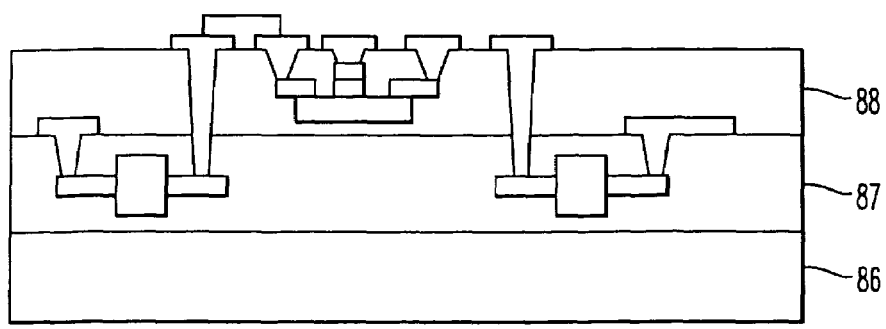
FIG. 19 is a diagram of bonded and interconnected 2-D arrays of circuit elements.

Third wafer and subsequent wafers may also be processed where the substrate is removed to create a 2-D array of devices ready to be interconnected to the first and second arrays. The third device may be yet another technology. FIG. 19 gives an example.

The wafer bonding may consist of bonding an integrated circuit or device to another substrate used for thermal spreading, impedance matching or for RF isolation, an antenna, or a matching network comprised of passive elements. Combinations of these elements may also be integrated. Partial or complete substrate removal may be included in this embodiment. The circuit or device may be interconnected with the antenna, spreader or other element.

An integrated T/R module may also be manufactured where a MEMs on one substrate is integrated with an output transmit power amplifier on another wafer. An input receive wafer may be integrated on the second wafer or on a third wafer. Appropriate shielding or isolation may also be integrated in the module, as well as an antenna formed on a wafer.

Optical devices, such as lasers and detectors, on one wafer may be integrated with optical interconnect circuits on another wafer. The elements are integrated to a sufficient fraction of a wavelength to operate as lumped elements so that impedance mismatch between the devices does not cause significant reflection or loss of power. The resulting optical configuration made possible with the invention operates at high speed due to low parasitics, and at low power due to avoiding the impedance mismatch problem limiting conventional optical I/O configurations.

The wafer bonding may also follow from FIGS. 3 and 4 where wafer 10 is a device or circuit wafer and wafer 16 is a support and packaging material as follows. This particular description is of particular interest as a packaging technology that provides improved thermal performance, improved noise performance, separation of power, ground, clock, and/or signal lines, improved radiation performance, reduce resistance, capacitance, and inductance, increase power to ground coupling, to name a few. After bonding, the substrate from the device or circuit wafer is substantially thinned or completely removed. The remaining portion of the substrate may be no more than 10 to 20 µm. Additional processing may proceed on the remaining silicon substrate or "backside" or, alternatively, if the substrate is completely removed, on the "backside" of the layer containing active devices.

Figure 20A:
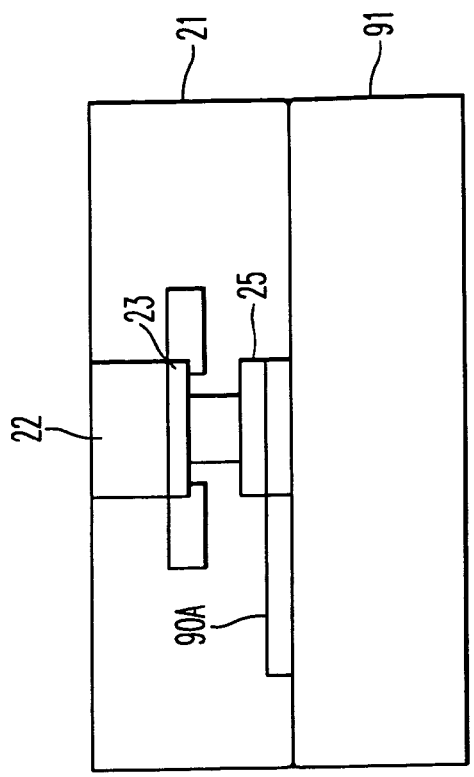
Figure 20B:
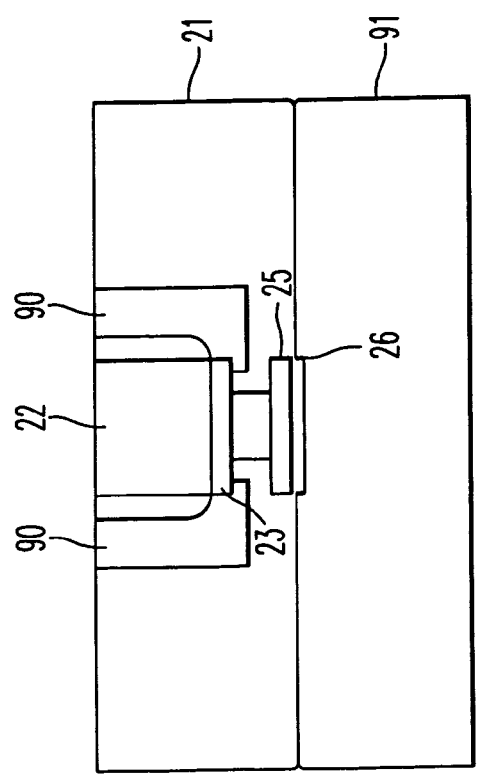

For example, vias can be made to the underneath side of "pads" made on the "frontside" of the wafer. These "pads" may be optimally designed for this purpose and thus have a significantly different configuration from a typical pad. For example, this pad may essentially be a via, that is started on the frontside processing of the wafer, and interconnected from the back. An example of this is shown in figure in FIG. 20A where base contact 90 has a via structure extending to the backside of the device now exposed through removal of the substrate. FIG. 20B shows an extended metal contact 90A accessible through an appropriately placed via.

There are various types of vias that can be formed. For example, vias can be formed on the "top" interconnect level, a "lower", or a "first" interconnect level next to the devices, or directly to the active device from the backside. After these different types of vias are made, an interconnect can be formed in the via, thus interconnecting any level of interconnect made on the frontside of the wafer or the active devices directly. Additional levels of metalization may also be formed on the "backside" similar to the multiple interconnect levels formed on the "frontside." After this "backside" processing is completed, the wafer can be diced and packaged according to typical methods like wire bonding and ball grid array.

This configuration allows routing of power, ground, clock, and signals on either or both sides of the active device layer. For example, power and ground can be routed on one side and ground, clock, and signals can be routed on the other. Other configurations are possible, and a combination of configurations can be used as desired. This configuration allows reduced resistance, inductance, and capacitance, and allows interaction between different types of interconnects to be minimized, for example power and signal, or maximized, i.e., power and ground, as desired.

Figure 20C:
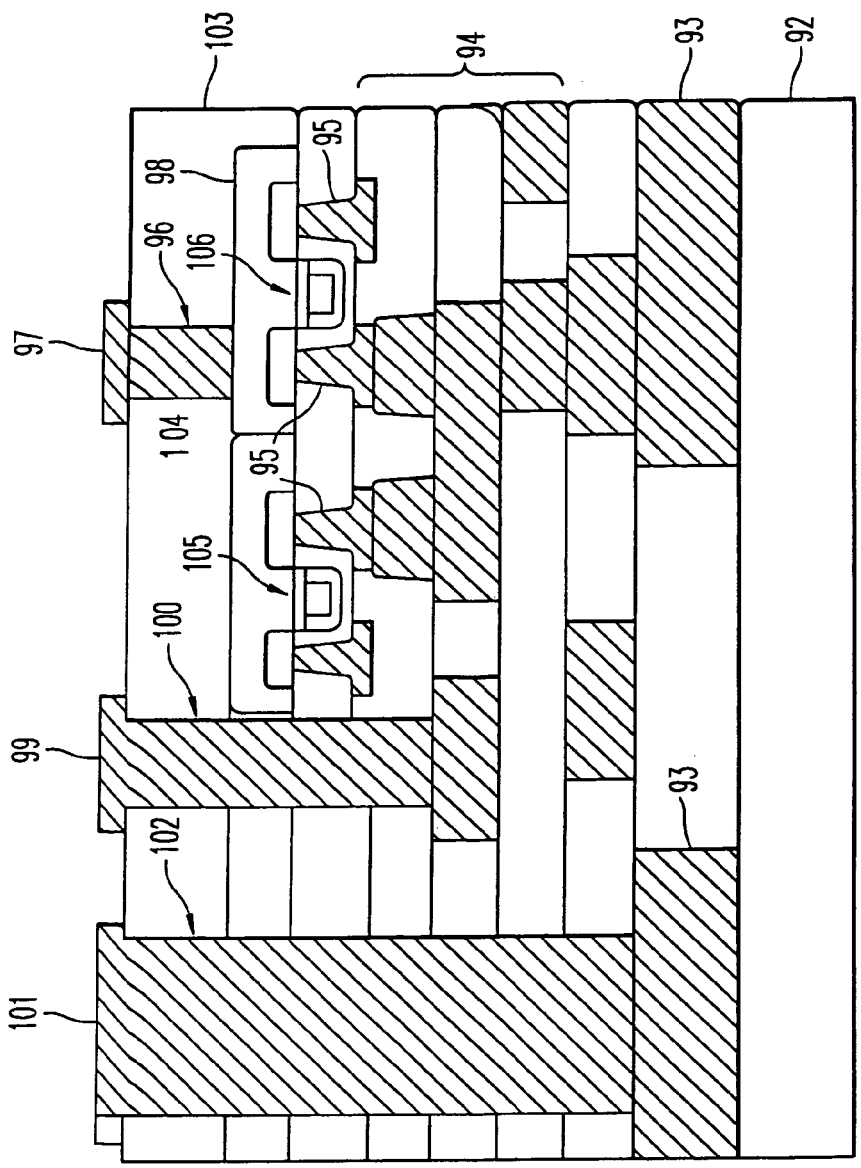

An example is shown in FIG. 20C. It should be noted that the dimensions shown in FIG. 20C (and other figures) are not drawn to scale but have been drawn for the purpose of illustrating the invention. The dimensions shown are not meant to limit the invention. A pair of devices 105 and 106 are interconnected with other circuit elements (not shown) via a number of interconnect layers 93–95. The device is bonded to material 92 which can be used as the die attach. Via 102 is filled with interconnect 101 connected to a "top" level interconnect layer 93. Via 100 is filled with interconnect 99 connected to one of intermediate interconnect layers 94. Via 96 is formed through layer 103 to connect device region 104 with interconnect 97. Layer 103 may be the remainder of a native substrate substantially thinned or, if the native substrate is completely removed, a layer between native substrate and devices 105 and 106 or a layer formed on devices 105 and 106 after substrate removal. While not labeled the material separating the various interconnect layers is understood to be a insulating material.

Figure 20D:
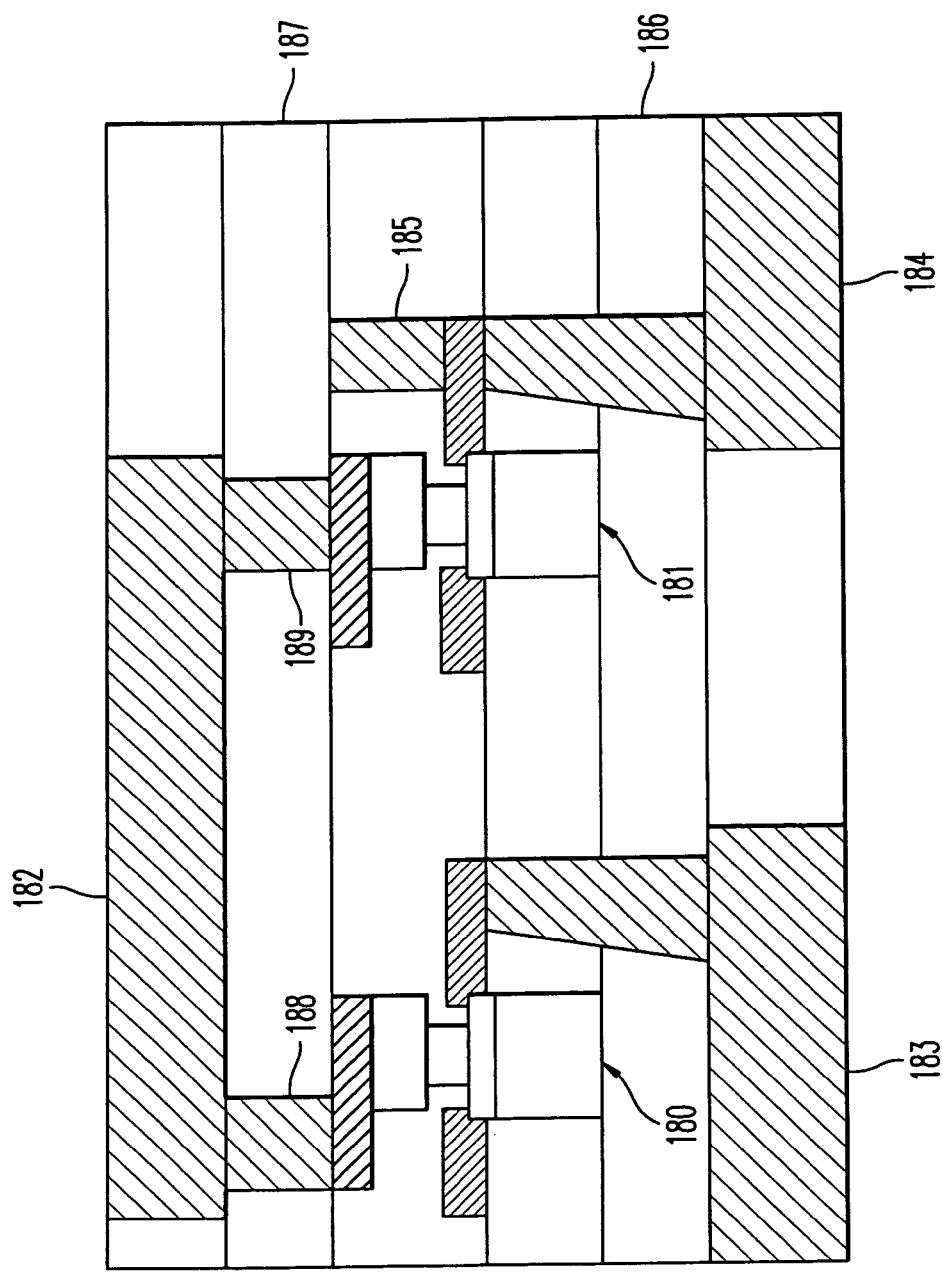

Another example is shown in FIG. 20D where two devices 180 and 181 are connected from both sides through substrates 185 and 187 to which the devices are bonded. Interconnects 182, 188 and 189 are formed through substrate 185 and interconnects 183 and 184 are formed through substrate 186. Substrates 185 and 186 and devices may include a planarization layer for bonding as described previously.

It should also be noted that the vias made to the various levels may pass through semiconductor material. In this case, measures such as oxidizing the exposed semiconductive material in the vias before filling may need to be taken. Also, the device may be formed on an insulative substrate with the areas through which the vias are formed being entirely insulative. This may be accomplished, for example, by fully oxidizing the semiconductive material in these areas through which the vias pass, by completely etching away the semiconductor material and refilling with insulative material, or a combination of the two.

Note that a thermal spreader material can also be used as the die attach material 92. It can further be a composite material. The composition may be optimized, for example, it may contain mostly copper where it will be bonded to the die, and may contain another material conducive to die separation where it will be bonded to the streets between die.

This configuration further provides improved thermal impedance compared to a conventional package. For example, typical packaging has the silicon substrate between the active device layer that generates heat and the die attach to the package. The silicon is typically ~600 microns, but is also typically thinned to ~300 microns. There is a limit to the thinning in production determined by breakage. Heat generated in the active layer typically conducts through the ~300 micron substrate to a copper heat spreader, or a similar thermal conductivity material and from there to a heat sink to ambient. This heat spreader material is typically ~24 mils thick or ~600 microns. Since the thermal conductivity of the copper is about 3 times that of the silicon, more than half the temperature rise in the part is accommodated in the silicon substrate.

In an alternate wafer bonding configuration, where material 92 is a copper-like material of similar thickness to the conventional plug, the temperature rise is reduced by more than half because the temperature drop across the planarization material is negligible compared to the temperature drop across the silicon substrate for appropriate planarization materials and thickness. Examples of appropriate planarization materials and thicknesses are 0.5 microns of silicon dioxide and 5 microns of silicon nitride.

Note that a much larger reduction in temperature rise is obtained if the heat sink efficiency is such that the copper heat spreader can be omitted without causing a significant rise in heat sink temperature. In this case, the temperature drop across~two microns of silicon nitride is about one tenth the temperature drop across 300 microns of silicon for the same heat flow, resulting in about one tenth the temperature rise of the part.

Figure 20E:
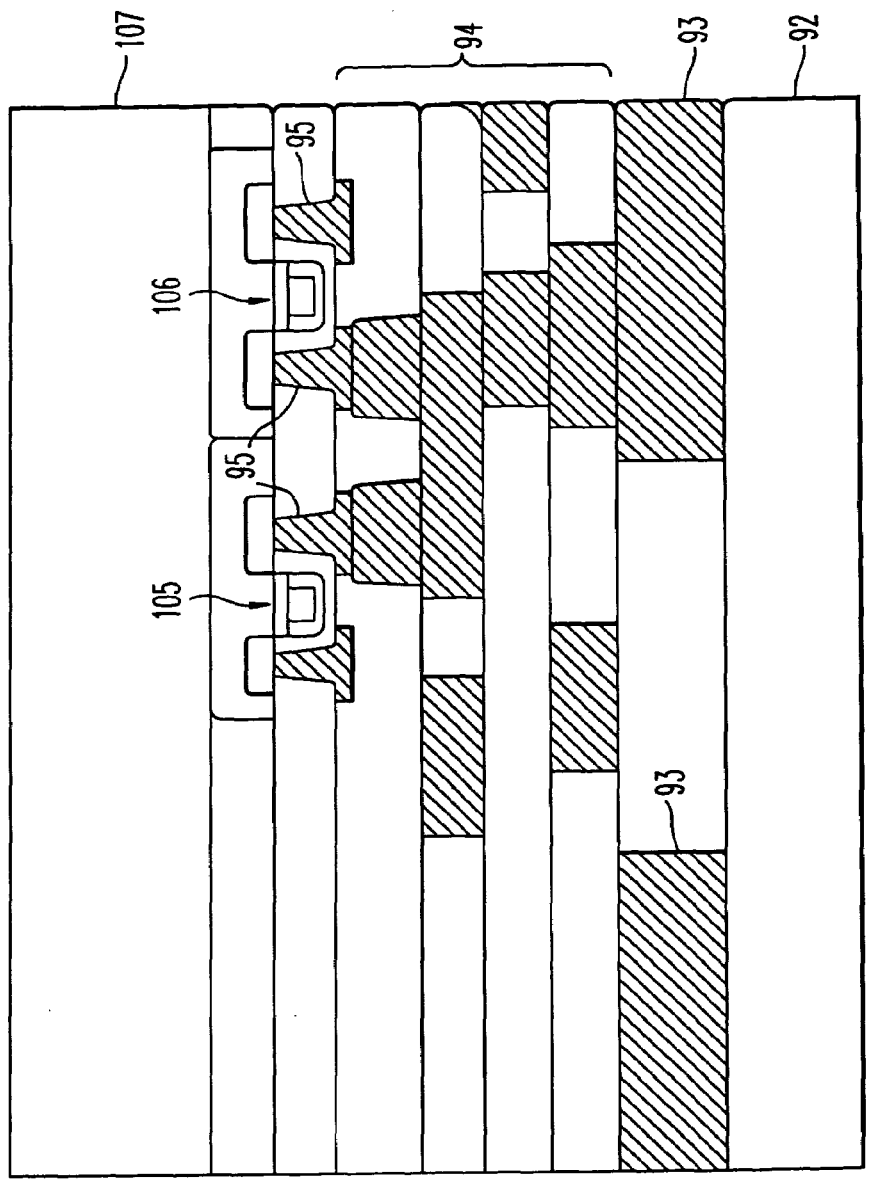

Further improvement in thermal impedance can be obtained by wafer bonding a second packaging material on the backside of the device or circuit wafer after the substrate is substantially thinned or completely removed, as shown in FIG. 20E. Substrate 103 in this example has been completely removed and a second packaging material 107 is bonded to the surface exposed by the substrate removal. Substrates 92 and 107 may be chosen to have high thermal conductivity, to more effectively spread and remove heat from the device. Access to layers 93–95 or to the active devices themselves may by made through one or both substrates 92 and 107, depending upon the type of interconnecting or packaging scheme.

The bonding of substrate 107 may also be done after further backside processing, an example of which is provided above. This replacement of the silicon substrate with an alternate material reduces the thermal impedance accordingly. When used in conjunction with the heat removal from the frontside as described above, the thermal impedance is further improved. Heat sinks can be applied to front and back surfaces, or the front and back packaging materials can be thermally shunted with an appropriate material.

This sandwiching of the device or circuit wafer with appropriate material is most preferred when used in conjunction with ball grid array packaging technology, or an alternate packaging technology that does not use ball grid array, but uses an alternate areal contacting method in subsequent assembly. FIG. 20F shows interconnecting the structure of FIG. 20E to the interconnect levels using a ball grid array with balls or bumps 109 and underbump metalization 108. The ball grid array method can be straightforwardly applied to this description by forming interconnects through the packaging material to the desired connection points, followed by appropriate underbump metallization and ball grid formation.

An example of a packaging technology that does not use a ball grid array is given in 20G. This example uses a pin grid array 201. This array is formed in substrate 92 and includes interconnection 202 between pin grid array 201 and layers 93–95. Pins subsequently can be pressed into a board, card, substrate, or other subassembly. This assembly method eliminates the need for solder bumps, underfill, etc. typically used in advanced packaging. Alternatively, the exposed surface of 92 may be formed with exposed contact regions 203 that are interconnected to layers 93–95, that may be subsequently pressed onto a pin grid array formed on a board, card, substrate, or other subassembly.

This packaging method and device are also robust to thermal stress. The removal of essentially all silicon except that in the active device region, allows significantly greater compliance of the remaining silicon with respect to the packaging material. Further compliance of the silicon can be obtained by etching or removing all the silicon between the die after the substrate is thinned or completely removed. The greatest compliance is obtained by removing all silicon except where each active device is after thinning or completely removing the substrate. In this case, the silicon devices are not connected with silicon, but rather with planarization material and interconnect metallization. Intermediate amounts of silicon removal are also possible.

This configuration results in reduced stress and improved reliability compared to typical methods. Appropriate choice of packaging material and/or material to which the die will be further attached to obtain an acceptable strain, results in further reduced stress and improved reliability from typical methods like ball grid array that suffer strain induced failures.

Figure 21:
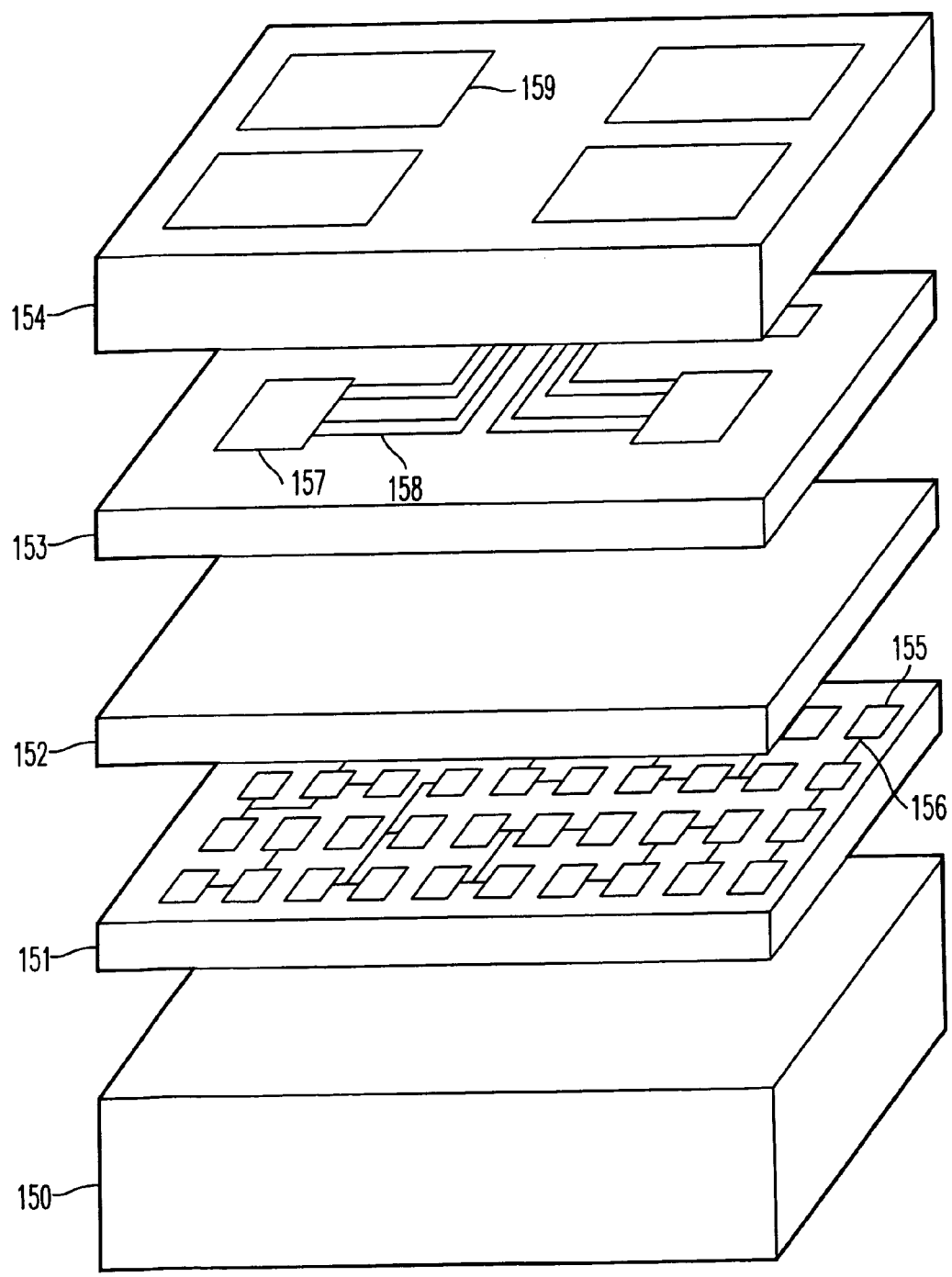
FIG. 21 is an exploded view of an device integrated according to the invention.

The wafer bonding may combine such elements with other components to create a system or a functional component of a system. FIG. 21 shows an exploded view of an system integrated according to the invention. In this system a high-density lower-speed device 151 is integrated with a high-speed lower-density device 153. Other elements, such as passive elements including thermal spreaders, isolation layers and antennas may be included.

On a substrate 150 is bonded a remaining portion of a wafer 151 having a high-density lower-speed silicon integrated circuit having elements 155 and interconnections 156. An example of such a device is a gate array. The substrate of wafer 151 has been removed, in the manner discussed above, and wafer 150 may be a thermal spreader. A low-density high-speed device 153, such as an HBT device (shown after substrate removal) is bonded to an insulating substrate 152 which has been bonded to wafer 151. Substrate 152 may have electrical as well as thermal insulative properties, and may also be a thermal spreader made of, for example, diamond or diamond-like carbon. Vias are formed (not shown) in substrate 152 to allow connection between the silicon device in wafer 151 and the HBTs in wafer 153. On wafer 153 is bonded an packaging substrate 154 having contact pads 159. Alternatively, substrate 154 may be an antenna with patch antennas 159 to receive signals for input to the HBTs. Interconnects (also not shown) are formed between substrate 154 and devices on the HBT wafer, and between substrate 159 and wafer 151, if desired or needed.

Another system that may be formed is a microprocessor with a high density of embedded memory. A microprocessor on one wafer (such as 10) may be bonded and interconnected with a second wafer (such as 16). This configuration enables a significant increase in the bit width while providing an increased communication rate between the processor and memory elements by reducing parasitics. Power consumption is also reduced by eliminating I/O drivers and level shifting between the processor and memory. The configuration further allows an increase in memory compared to the conventional approach of embedded memory within the chip. Further, the processor and memory design and manufacturing processes may be respectively optimized to produce a combination of optimally designed and fabricated devices free from design and processing compromises resulting from being manufactured on the same wafer or having to interconnect the two devices at the board level.

Figure 22A:
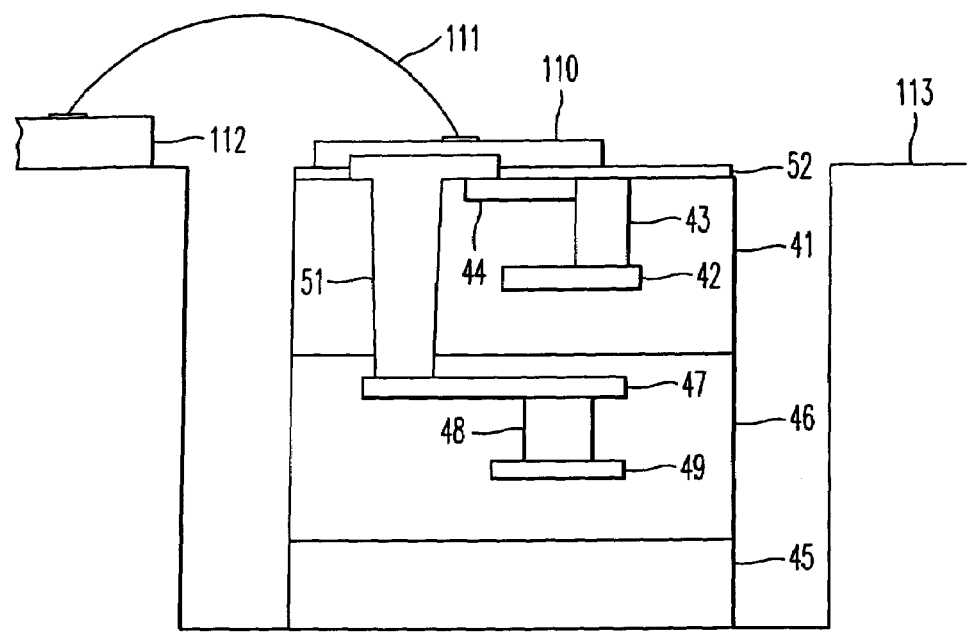
FIG. 22A is a diagram illustrating backside packing.

The wafer bonding may also include bonding a substrate primarily for mechanical support to a device or circuit wafer. This can be seen in FIGS. 3 and 4 where wafer 10 is a device or circuit wafer and element 16 is a support substrate. The substrate of the device or circuit wafer 10 is then partially or completely removed and the wafer may be packaged by connecting to the "backside" of the wafer from where the substrate has been removed. For example, FIG. 14 shows wafer 41 from which substrate 40 has been removed and interconnect 51 has been formed. As shown in FIG. 22A, wafer 41 is mounted in a package 113 (shown in simplified manner to illustrate the invention). Film 52 of wafer 41 was removed to expose interconnect 51. On interconnect 51 is formed a bonding pad 110, which is connected to package pad 112 by a wire 113. Connections to the other device terminals are not shown. Other packaging arrangements, such as flip-chip mounting, are possible. It is also possible to integrate three or more elements or wafers, including a multi-layer interconnect. These methods and devices may also comprise the omission of elements 46 and/or 45.

Figure 22B:
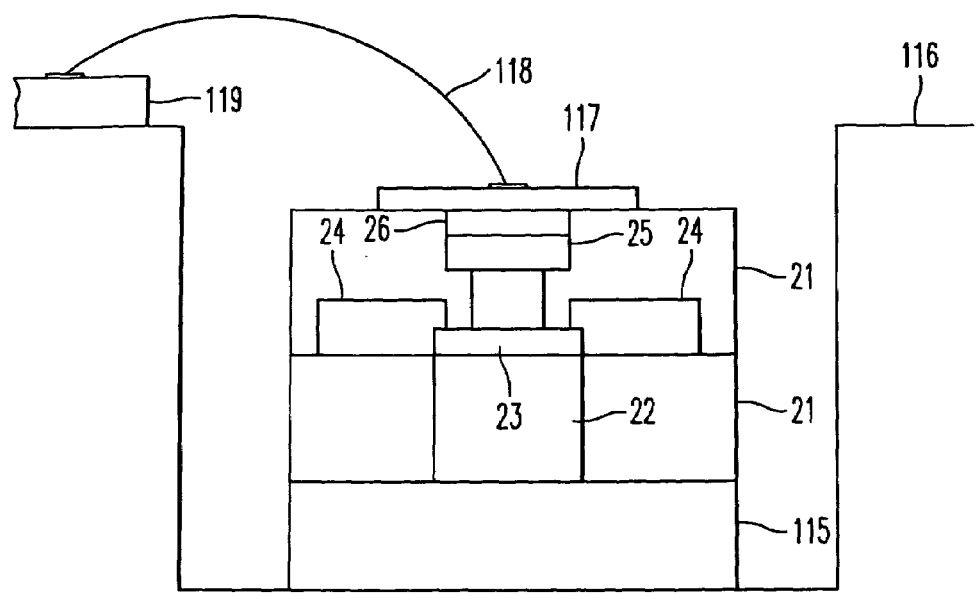
FIG. 22B is a diagram illustrating top side packing.

In another example, a device or circuit wafer is bonded to a first substrate and the substrate of the device or circuit wafer is removed. A second substrate having preferred thermal, isolation and/or mechanical properties is then bonded to the side of the device or circuit wafer exposed after the substrate removal. The first substrate is then removed exposing the "top" side of the device or circuit wafer. Starting with the device shown in FIG. 6, substrate 20 is removed and a second substrate 115 is bonded to the backside of the HBT device. Substrate 10 is then removed to expose the top side of the HBT device. The integrated device may then be mounted in a package 116, as shown in FIG. 22B. On contact 26 is formed a bonding pad 117. Pad 117 is connected to package pad 119 via wire 117. Connections to the other device terminals are not shown. Other packaging arrangements are possible, such as using a device having a multi-layer interconnect bonded thereto, and flip-chip mounting.

Figure 23:
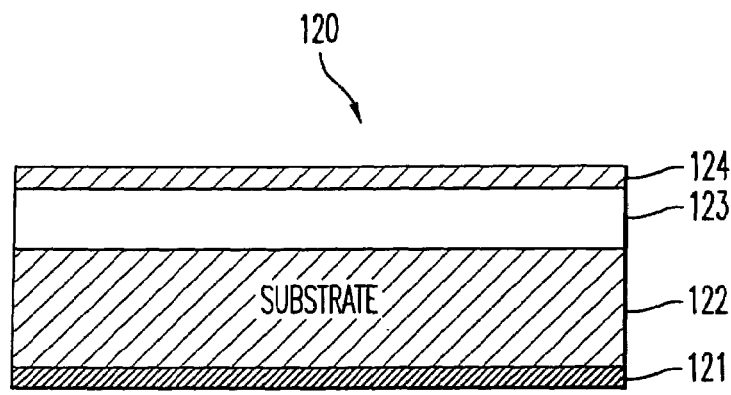
FIGS. 23–34 are cross-sectional diagrams of a method of integrated solar cells according to the invention.
Figure 24:
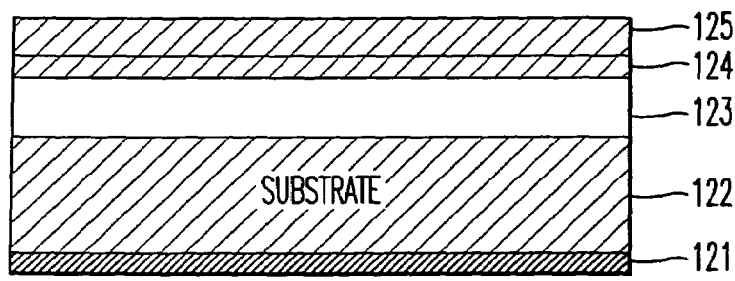

Stacked solar cells may also be integrated according to the invention. In FIG. 23 a first solar cell 120 is shown in cross-section. Solar cell 120 contains back contact 121, substrate 122, active area 123 and top contact 124. Cell 120 is then planarized with a bonding material 125 polished to a high degree of planarity and smoothness (FIG. 24), in the manner discussed in the first embodiment. Back contact 121 may also be omitted for subsequent formation after substrate 122 is substantially thinned or removed.

Figure 25:
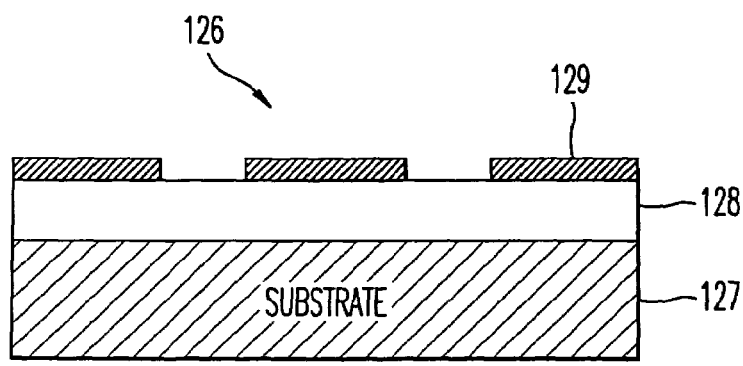
Figure 26:
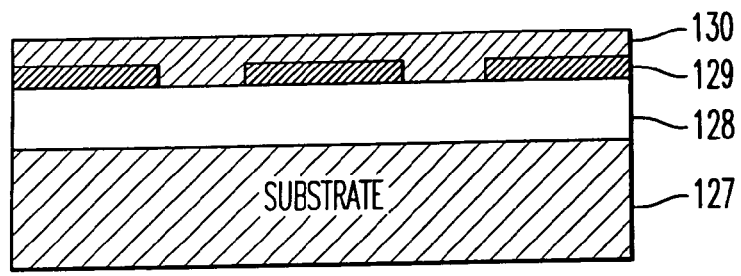
Figure 27:
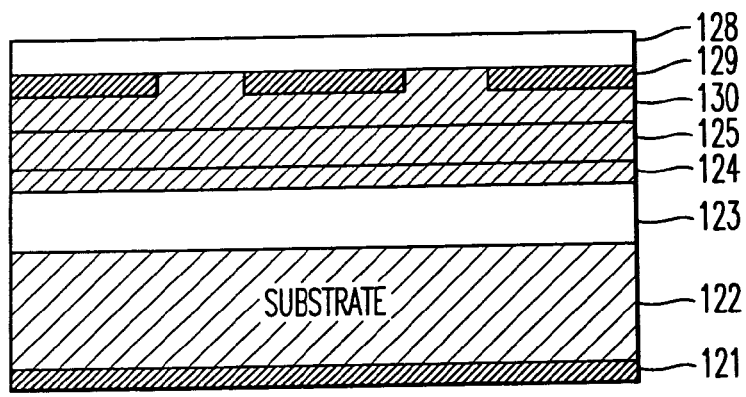
Figure 28:
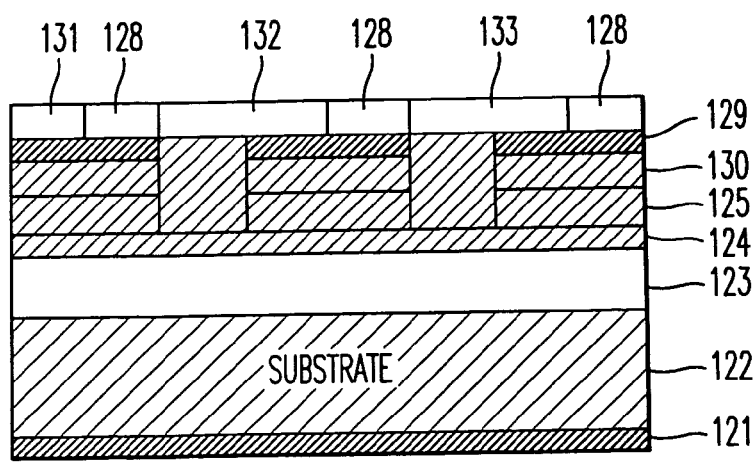
Figure 29:
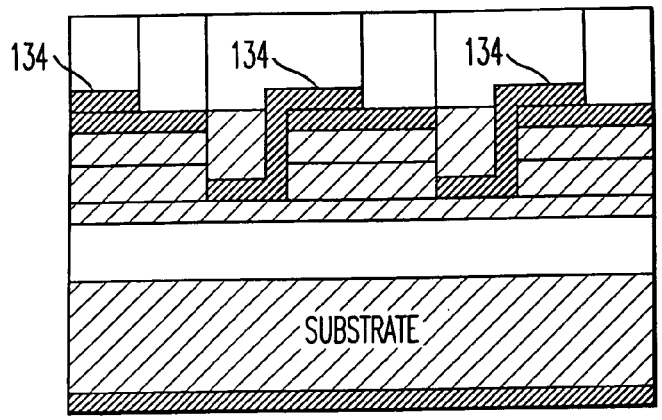
Figure 30:
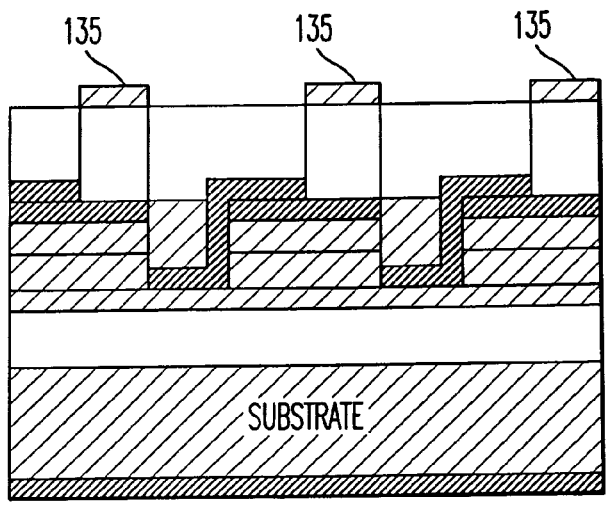

A second cell 126 is prepared, having substrate 127, active area 128 and contacts 129 (FIG. 25). In FIG. 26, bonding material 130 is deposited on cell 126 and planarized in the manner discussed in the first embodiment. Cells 120 and 126 are bonded and the substrate of cell 126 is removed by, for example, lapping and polishing, as shown in FIG. 27. Vias 131–133 are formed to expose portions of contacts 124 and 129 (FIG. 28), interconnects 134 are formed in the vias (FIG. 29) and contacts 135 are formed to the second cell (FIG. 30).

The solar cells integrated according to the invention have increased efficiency while maintaining a high degree of optical transparency between cells. Low interconnect resistance and high mechanical strength are also achieved. The stacking shown in this example reduces the contact area by about half which is acceptable for a typical contact ($<10^{-5}$ ohms-cm$^2$) and interconnect resistance ($<10^{-6}$ ohm-cm$^2$). Both single junction and tandem junction cells may be stacked using the invention. The mechanical stacking made possible with the invention avoids integration with epitaxial techniques which introduce lattice match growth limitations associated with tandem or cascade cells. It further provides improved mechanical strength compared to other mechanically stacked solar cells and is mechanically compliant to temperature variations due to the substantial or complete substrate removal. Optimum compliance is obtained by removal of the active layer between cells on a substrate, and/or by designing the via and interconnect pattern to appropriately reduce the area of the continuous active layer across the entire substrate area in a manner similar to that described previously for packaging.

Figure 31:
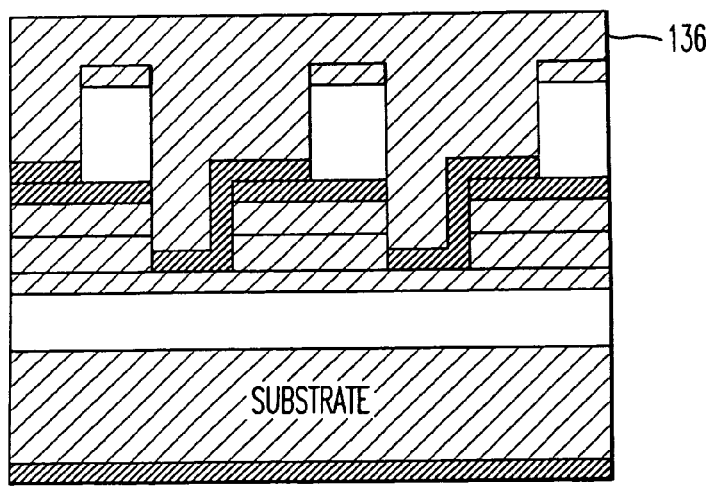
Figure 32:
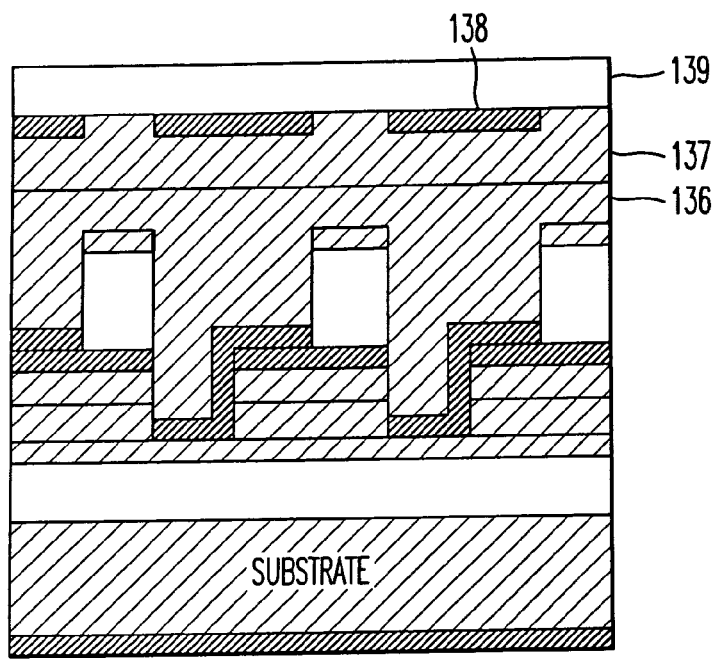
Figure 33:
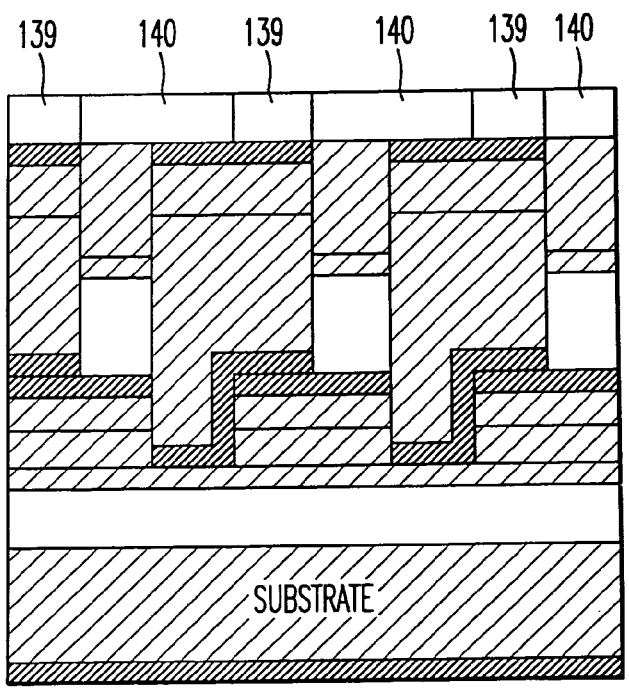
Figure 34:
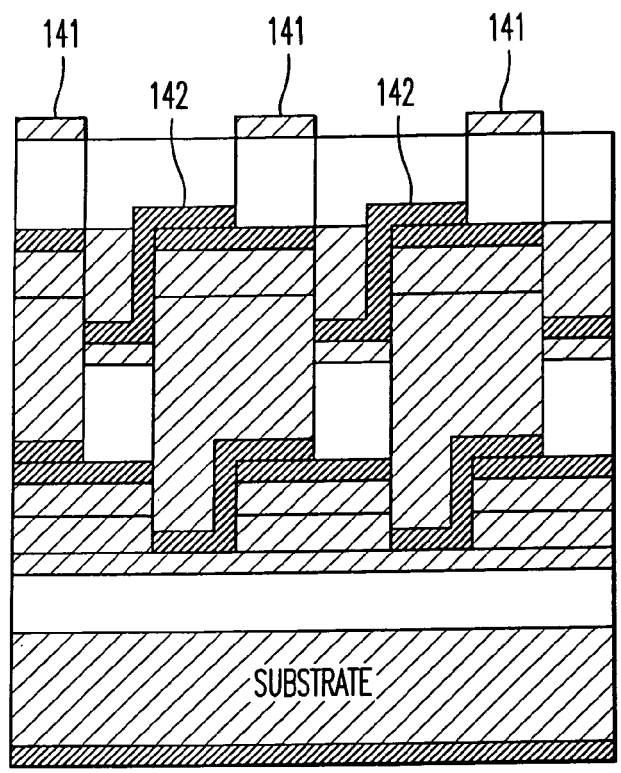

More cells can be stacked using the invention. As shown in FIG. 31, bonding material 136 is formed over the cells stacked in FIG. 30, and planarized in the manner described above. A third cell having planarized bonding material 137, contacts 138 and substrate 139 is bonded on material 136 (FIG. 32) and vias 140 are formed (FIG. 33). Contacts 141 and 142 are then formed (FIG. 34).

Figure 35:
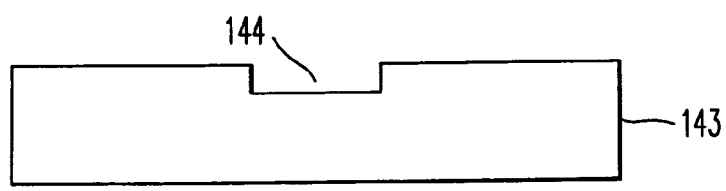
FIGS. 35 and 36 are diagrams of integrating devices with voids.
Figure 36:
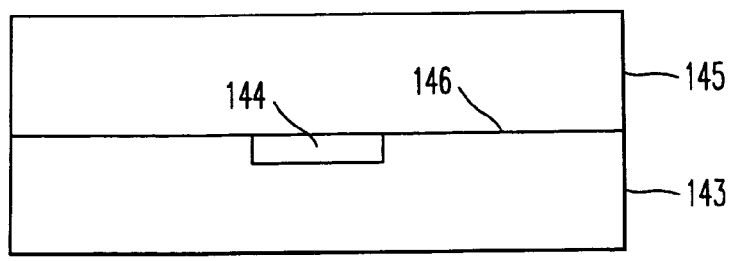

FIGS. 35 and 36 show another aspect of the invention where a void 144 is formed in one wafer 143 before or after surface planarization. Subsequent bonding to a second wafer 145 creates an intentional void near the bonding interface 146. The void may be a via for later connection to devices located in wafer 143.

The integration method according to the invention may further include the bonding of wafers, die, surfaces, etc., of dissimilar areas. Examples of how this may be accomplished include first, the attachment of small areas to a larger area followed by bonding of the larger area to another larger area or, second, bonding of small areas to larger areas are described below.

For example, in the first approach it may be desired to integrate an optical device(s) with an electrical circuit to realize electronics with optical input/output (I/O). In this example, the area required for the optical devices (i.e. vertical cavity surface emitting lasers (VCSELs), p-i-n photodiodes, etc.) will typically be much less than the area required for the electronic circuit. Furthermore, the wafer size where the optical devices are fabricated will be typically smaller than the wafer size where the electronic circuits are fabricated. It is thus not preferable to bond the smaller wafer with a higher area density of devices/circuits to the larger wafer with the smaller area density of devices/circuits because the electronic circuits would be integrated with either many more optical devices than needed, or with no optical devices.

Figure 37A:
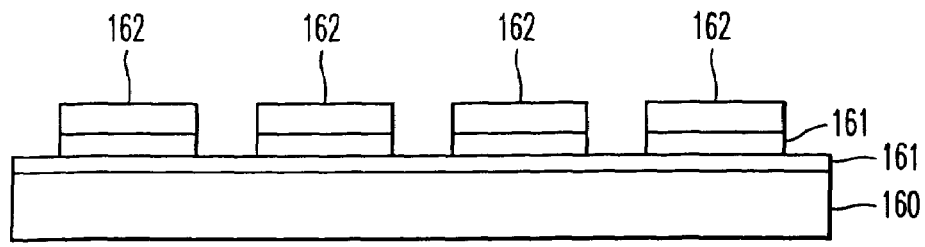
FIGS. 37A–37H are diagrams illustrating bonding plural dies or devices to a substrate according to the invention.

In a preferable method the die needed to be bonded are separated from the smaller wafer by conventional dicing, etc., the separate die are assembled on a carrier wafer of comparable size to the larger wafer containing electrical devices, and the larger wafer and the carrier wafer are bonded. This is shown in FIG. 37A where smaller dies or devices 162 are bonded to a substrate 160 with bonding material 161. Substrate removal may then take place, if desired, and interconnections between the bonded devices may be made using the methods described above. Examples of the interconnections are shown in FIGS. 37E–37H and described below. The die separation would preferably be preceded by planarization of the wafer containing the dies required for wafer bonding. The die can also be preferentially tested prior to this planarization to assist sorting prior to assembly on a larger wafer.

Figure 37B:
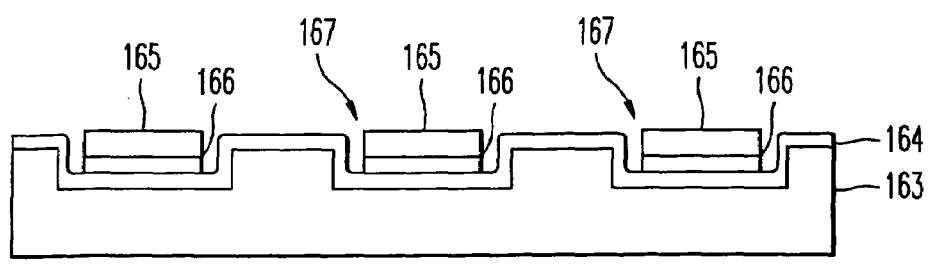

The assembly of die on a larger wafer can be done in a variety of ways including formation of a recess in a specific location that will mate with the other wafer containing electrical devices as desired, as shown in FIG. 37B where in recesses 167 or substrate 163 are bonded devices 165 using bonding materials 164 and 166. Other methods are also possible including die attach, etc. For example, bonding materials 164 and 166 may be omitted if the die and recess sizes are suitable for a press fit.

Figure 37C:
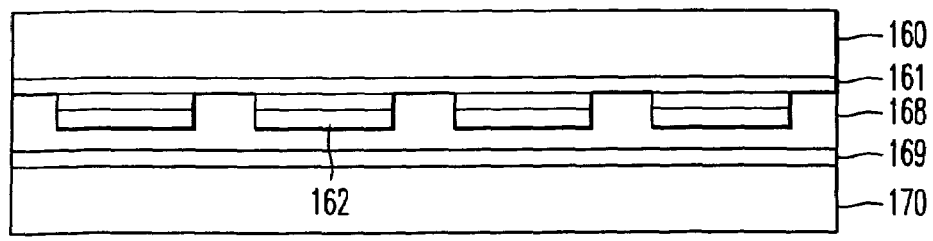
Figure 37D:
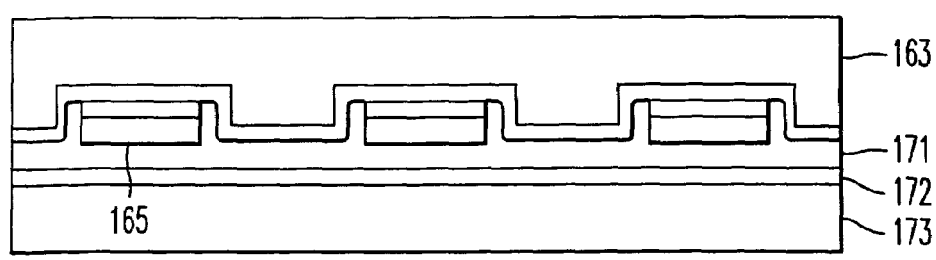

After die are assembled on the carrier wafer, the resulting wafer is planarized for bonding to the larger wafer with electronic devices. This planarization can be facilitated in a manner consistent with the die assembly. For example, if die are assembled in a recess, the recess can be formed to match with the die thickness so that the die surface corresponds to the larger wafer surface. FIGS. 37C and 37D illustrates the planarization of the structures shown in FIGS. 37A and 37B, respectively, and bonding to corresponding substrates. In FIG. 37C, wafer 160 with devices or dies 162 are bonded to a substrate 170 using bonding materials 168 and 169. Wafer 170 preferably contains an electronic device to which die or devices 162 are to be interconnected. Also, wafer 170 may be a thermal spreader and another substrate may be bonded to devices or die 162 from the other side following removal of substrate 160. FIG. 37D is similar where substrate 163 is bonded to substrate 173 using bonding materials 171 and 172.

Figure 37E:
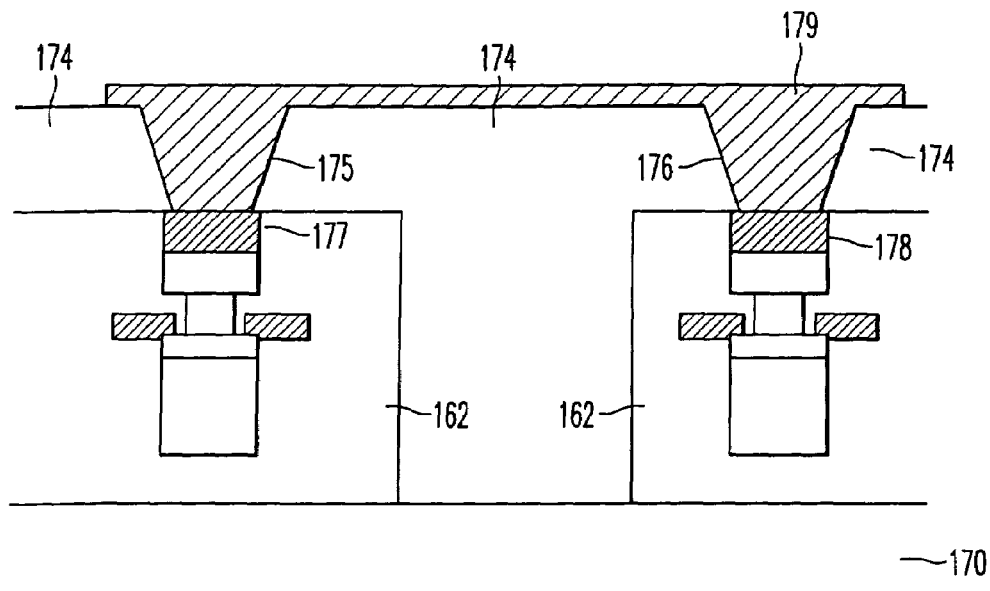
Figure 37F:
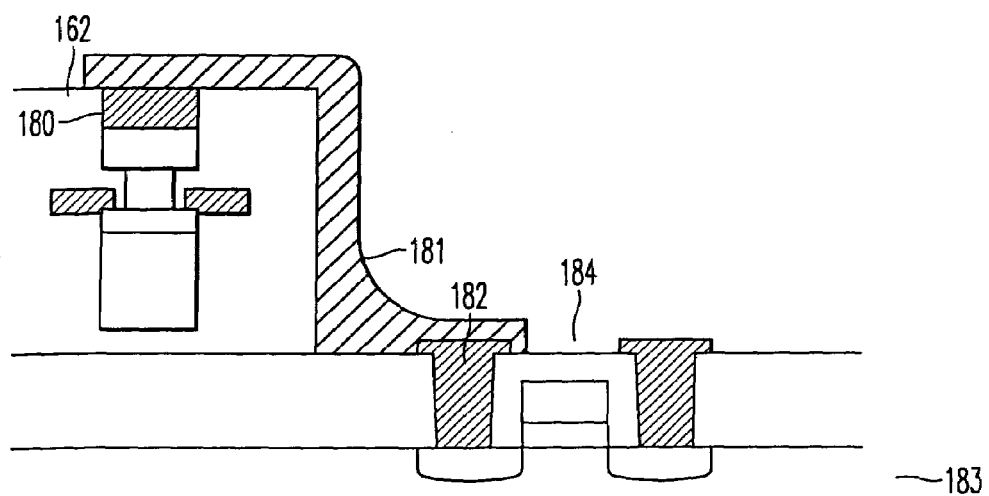
Figure 37G:
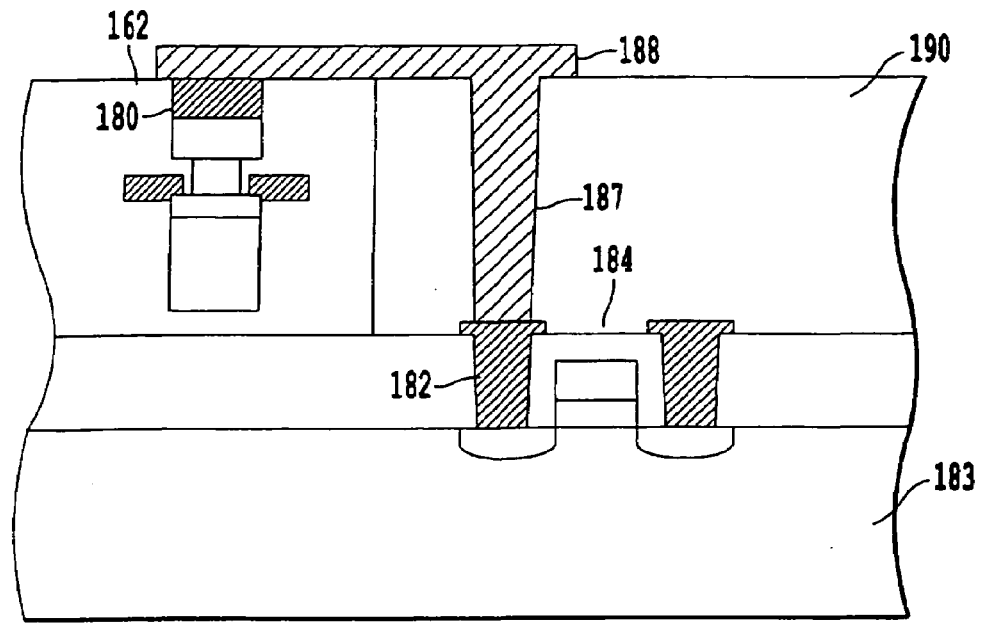

Connections between the die 162 and the underlying substrate 170 are shown in FIGS. 37E–37G. In FIG. 37E connections between two of the die 162 are formed, in the manner described above in connection with FIGS. 13–14, by depositing a layer of planarizing material 174, forming vias 175 and 176 over contacts 177 and 178 in the die 162, and depositing metal 179 over material 174 and into vias 175 and 176. Another example shown in FIG. 37F illustrates making connections between one of the devices in substrate 170 and devices in the die 162. The substrate(s) of the die 162 is (are) removed, as discussed above with respect to FIGS. 12 and 13, and a connection 181 is formed between contact 180 of a device in die 162 and a contact 182 in a device 184 in substrate 183. A third example shown in FIG. 37G includes depositing a planarizing material 190 over die 162 and substrate 183 having device 184 (only one shown for brevity), etching and/or polishing material 190, if necessary, to expose a contact 180 in a device in die 162, forming a via 187 in material 190 to expose a contact 182 of device 184, and depositing metal or conductive material 188 to connect contacts 180 and 182. It is noted that planarizing material 190 could extend over die 162 and another via opened to expose contact 180.

Figure 37H:
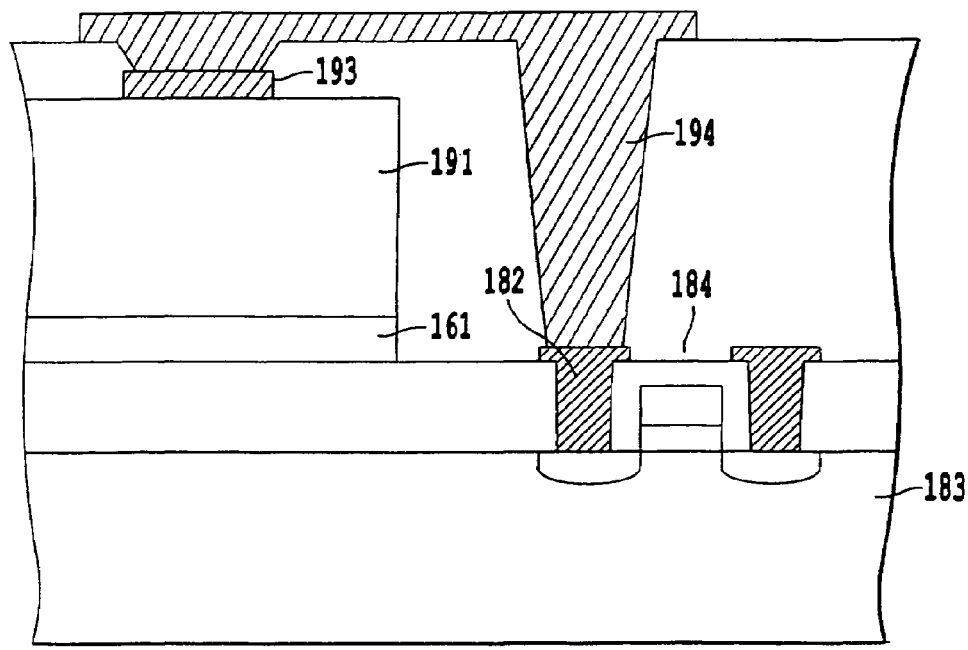

As discussed above, the substrate may be partially removed leaving a portion in contact with the devices. FIG. 37H illustrates the case where a portion 191 of the substrate remains after grinding/etching. Contact 193 is formed on portion 191 and a via is formed in material 190 to expose contact 193. Metal 192 connects contact 193 and device 184.

Alternatively, the wafer resulting from die assembly may be bonded without planarization of the entire wafer. For example, the die may be assembled such that the die are higher than the wafer they are assembled on and they are essentially at the same height. In this example, the subsequent bonding will occur primarily where the assembled die are and not over the entire wafer surface that includes the assembled die. Substrate removal of this wafer after wafer bonding may thus effectively result in separation of die before the die substrate is completely removed. After completion of die substrate removal (or substantially all the substrate), the die can be interconnected to the electronic circuits as described previously.

Furthermore, according to the second approach described above, a method similar to the first approach can be performed without assembling the smaller die on the carrier wafer. In this example, the smaller die can be separately bonded to the larger wafer. After the smaller die are separately bonded and their substrates are completely or substantially removed, they are interconnected to devices, or circuits as described previously. To facilitate substrate removal in this example, a template of similar material to the die substrate removal can be attached around the bonded die to produce a preferable surface for substrate removal that may include grinding, lapping, etc.

This carrier wafer that the smaller die is bonded to may serve other functions than containing electronic circuits as mentioned above. For example, the larger wafer may also be used to reroute and interconnect the smaller die to each other. Other uses are also possible. In this case, referring to FIG. 37C as an example, interconnections may be made from both sides through wafer 160 to connect the various devices 162, and through substrate 170. Thinning of substrates 160 and 170 may be preferable to reduce via depths.

Figure 38A:
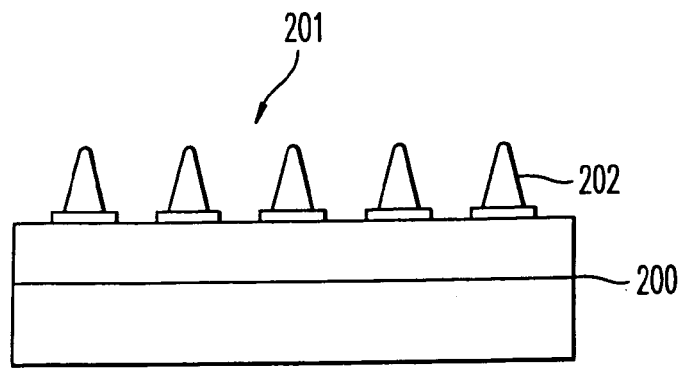
FIGS. 38A and 38B are diagrams illustrating connecting a bonded device to a circuit board or package.
Figure 38B:
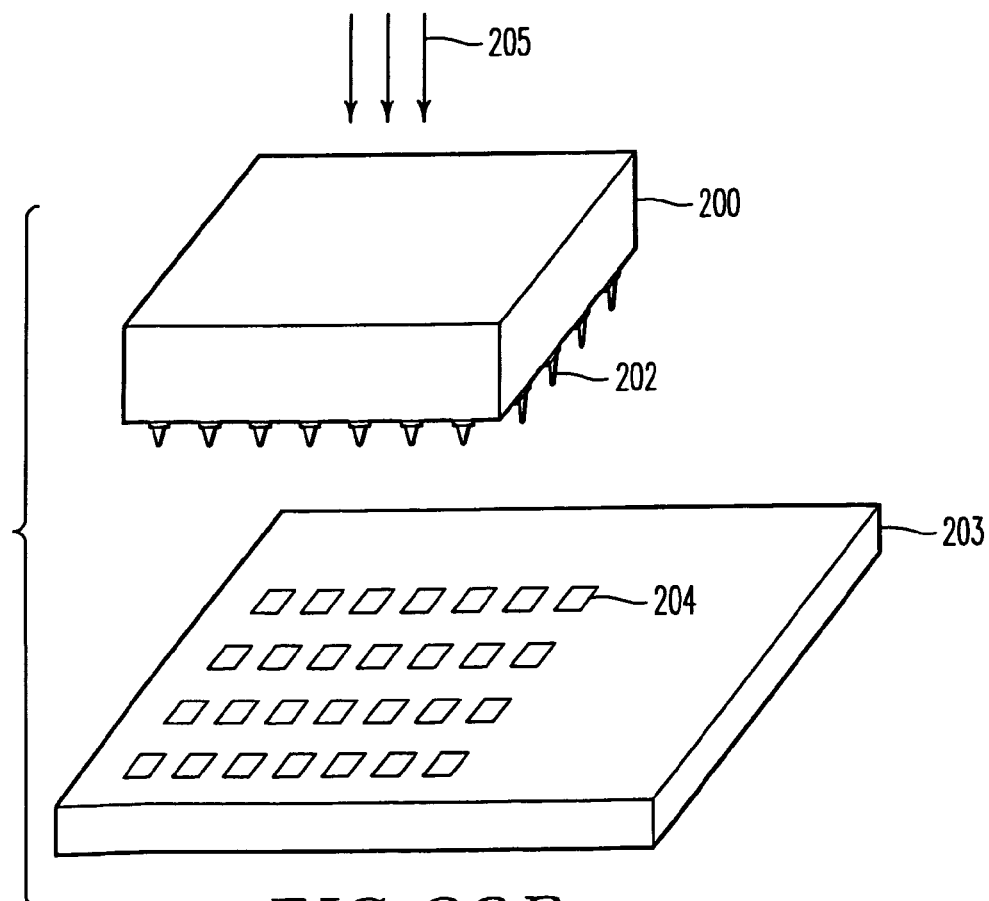

FIGS. 38A and 38B illustrate a further method of interconnecting a device with a circuit board, computer card, mother board, etc. The device can be a device bonded as described above, i.e. a device bonded to a packaging material. The packaging material bonded may have topography before bonding or have topography made after bonding that the subsequent via and interconnect can contact. This topography is engineered using common practices to allow a press fit, cold weld, sonic bond, or low temperature thermosonic bond etc., to be formed between this topography and a mother board, integrated circuit board, computer card, etc., that is designed to mate with this topography. This topography can be made with etching of the packaging material or deposition of an additional material. Depending on the quality and type of materials used, this topography can have a range of aspect ratios from flat to sharply peaked. This topography can exist on the packaging material and/or on the board to which the packaged devices or circuits will be subsequently attached. This mechanism of attachment does not rely on elevated temperature to reflow materials to make a connection as is done with solder bumps, ball grid arrays, etc. Accordingly, significantly reduced stress and increased reliability can be achieved. This method can also be manufactured with very low cost since the packaging of the devices or circuits can be done at wafer scale, and solder bumps do not need to be applied or reflowed to make an assembly of packaged devices/circuits to board, card, etc.

A more specific example is shown in FIG. 38A. On a top surface of a device 200 a pin grid array 201 is formed having "pins" 202. The pins are formed using conventional processing techniques such as metallization, photolithography, etching, etc. The pins 202 are metallic structures having a narrowed tip. Pins 202 are designed to mate with corresponding conductive structures such as metal pads on the circuit board, computer card, mother board, etc. The narrowed tip provides secure electrical contact with the corresponding board or card structures by pressing the pins against the conductive structures. The pins are shown having a pyramid shape but other shapes are possible. The pins 202 can be formed as small as in the range of 10 im in width and have an aspect ratio on the order of 1:1 to 1:3. It should be noted that while device 200 only shows a few pins 202, typically the device will have a large number of pins formed in an array, such as a square or rectangular matrix with possibly omitting pins at certain portions of the array or matrix.

FIG. 38B shows a board 203 having conductive pads 204, preferably metal pads, formed in a pattern corresponding to the array of pins 202. As indicated by arrows 205, pins 202 are brought into alignment and are pressed against corresponding ones of the pads 204. It is apparent that very small contacts may be formed in an array to allow a great number of interconnections to be made between the device being bonded and the board or card to which the device is bonded.

While particular devices and materials have been described in connection with the first and second embodiments, the invention is not so limited. The invention is applicable to any type of device formed on any type of substrate. Moreover, any type of technology may be used to fabricate the devices being bonded. For example, GaAs devices on a GaAs substrate may be bonded to HBT devices. Also, silicon-based devices formed on silicon wafers may also be bonded to either the GaAs-based devices or the HBT type devices. Technologies such as CMOS, BiCMOS, npn and pnp HBT, VCSEL, PIN, HFET, MESFET, MOSFET, HEMTS, MEMs and JFET may also be used.

The method according to the invention provides a three-dimensional, laminar integrated circuit structure. The device is a multi-chip module having a high integration density with reduced interconnection parasitics compared to other multi-chip modules. The module offers great flexibility as it can combine different devices and different technologies.

Figure 39A:
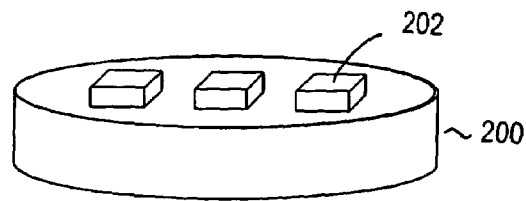
FIGS. 39A–39J are diagrams illustrating connecting smaller dies to an underlying substrate.
Figure 39B:
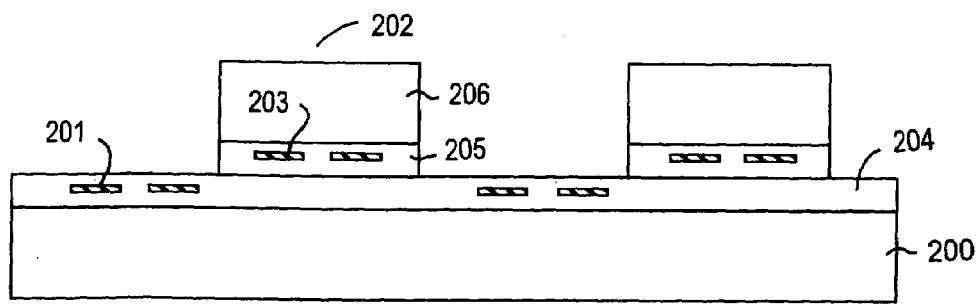

A further embodiment of the invention is shown in FIGS. 39A–39H. In FIGS. 39A and 39B, a substrate 200 having contacts 201 formed in material 204 is bonded to one or more smaller devices 202 having substrates 206 and contacts 203 (only two are shown for clarity in 39B) formed in material 205. The bonding is performed as described above, that is, devices 202 may be bonded to a carrier first, and then bonded to substrate 200, or devices 202 may be bonded directly to substrate 200 collectively or in several bonding operations. The materials 204 and 205 consist of interlayer dielectric material commonly used in forming layers of interconnections in semiconductor devices, such as oxide and/or polymer films.

Not shown are the active devices typically formed in the surface of substrate 200 and substrate 206 of devices 202. Substrate 200 may contain a completed integrated circuit such as a microprocessor, FPGA, or other logic circuit. Substrate 200 may alternatively contain devices or small circuits, or may consist of a package containing only interconnections. Smaller devices 202 may contain a memory device such as a PROM or RAM. Devices 202 may consist of other circuits such as a waveguide, MEMs, or audio circuit. Clearly, many combinations of substrate 200 and devices 202 are possible.

Figure 39C:
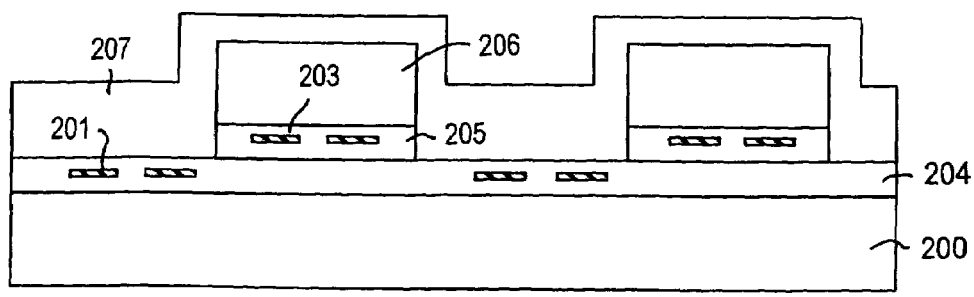
Figure 39D:
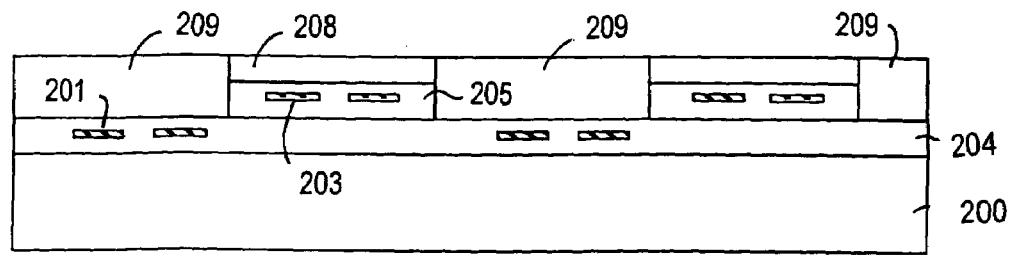

As shown in FIG. 39C, a passivation film 207 such as polyimide or photoresist is deposited over the substrate 200 and devices 202. The substrate of the devices 206 are removed, completely or partially, by grinding and/or etching. The structure shown in FIG. 39D illustrates the case where a portion 208 of substrate 206 remains, and a portion 209 on layer 204 remains. The remaining thickness 208 of the substrates of devices 202 is about 5–10 µm. Other thicknesses appropriate to the specific application may be employed.

Figure 39E:
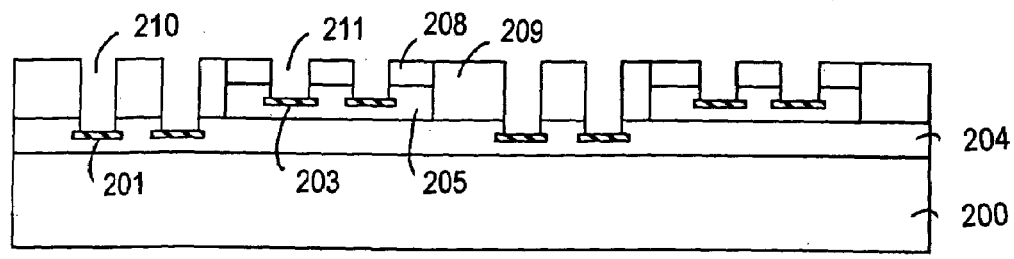
Figure 39F:
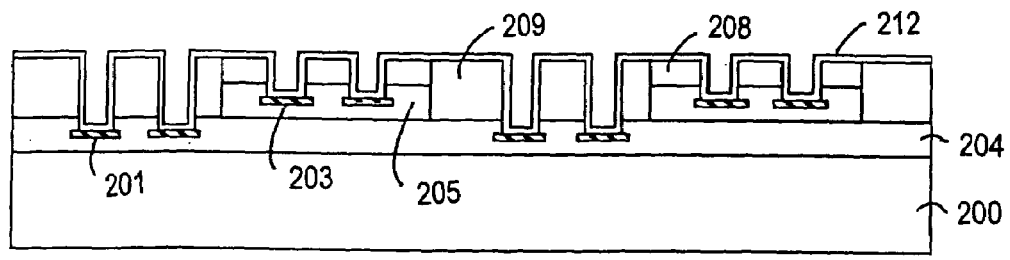
Figure 39G:
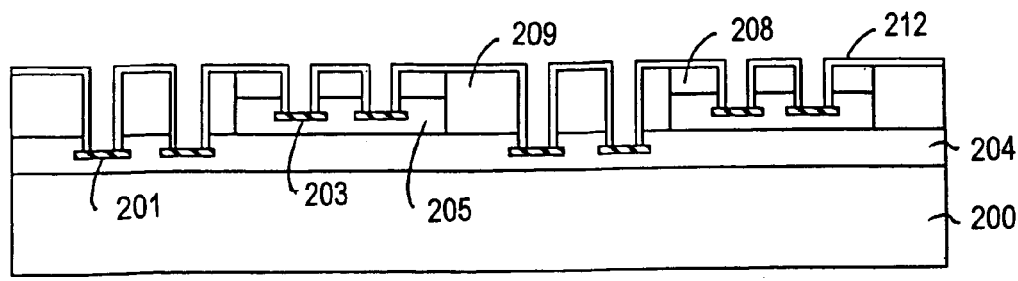
Figure 39H:
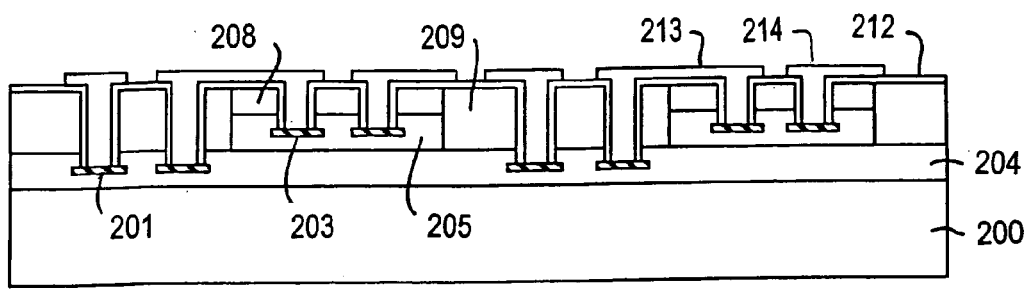

Contact holes 210 are formed through the remaining portion 209 and through layer 204 to expose desired ones of contacts 201, and contact holes 211 are formed through the thinned substrate 208 and material 205 to expose desired ones of contacts 203 (see FIG. 39E). An insulative layer 212, such as a conformal glass layer deposited by a vacuum plasma or sputter technique, is formed over the bonded structure and etched to remain on the sides of contact holes 20 while exposing desired ones of contacts 201 and 202 (FIGS. 39F and 39G). A conductive material such as a metal is then deposited and selectively removed to form structures 213 and 214, where structure 213 connect contacts 201 and 202 and structure 214 acts as a contact for later connection, as shown in FIG. 39H. Here structure 213 extends over the peripheral side and through the backside of device 202.

Figure 39I:
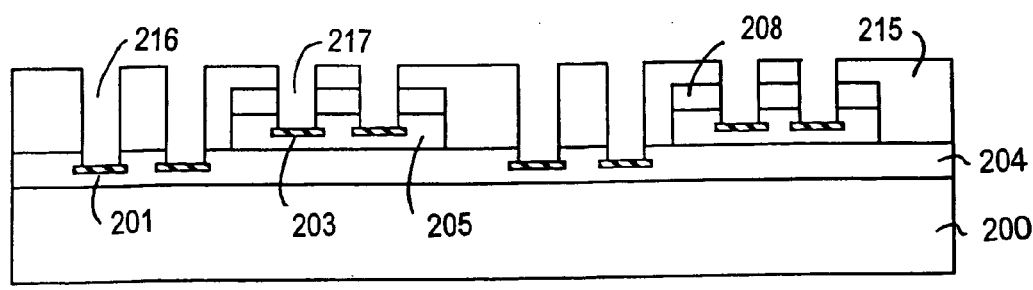
Figure 39J:
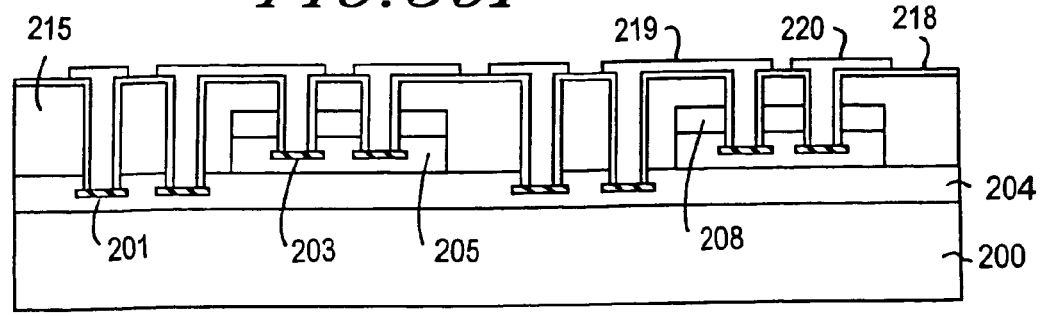

FIG. 39I illustrates where a planarizing 215 material is formed over devices 202 and substrate 200. Holes 216 and 217 are formed in material 215 to expose desired ones of contacts 201 and through portion 208 and material 215 to expose desired ones of contacts 202. A conformal insulative layer 218 is formed and etched as in FIGS. 39F and 39G, and conductive material such as a metal is formed as in FIGS. 39H to give contacts 219 and 220, providing the structure shown in FIG. 39J.

Figure 40A:
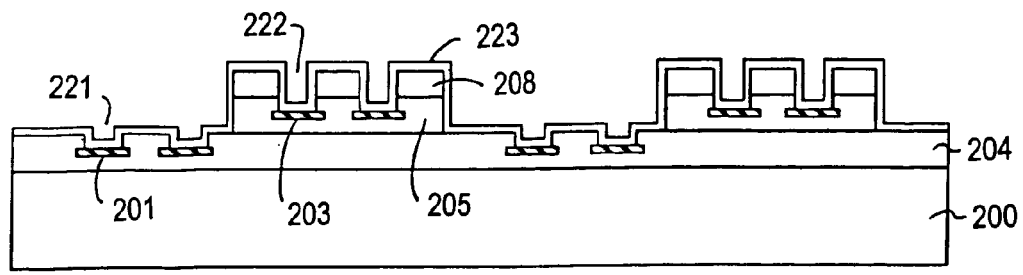
FIGS. 40A–40C are diagrams illustrating connecting smaller dies to an underlying substrate.
Figure 40B:
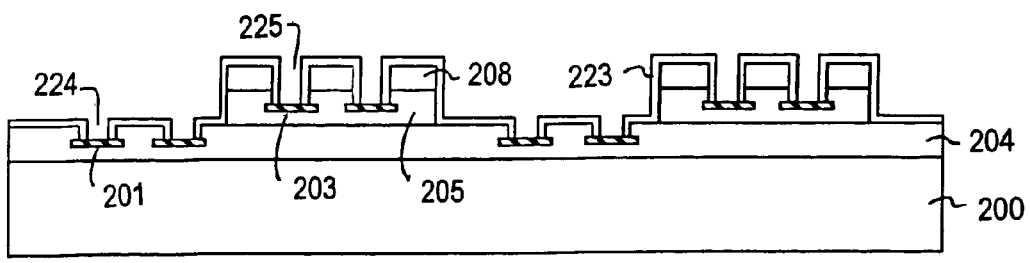
Figure 40C:
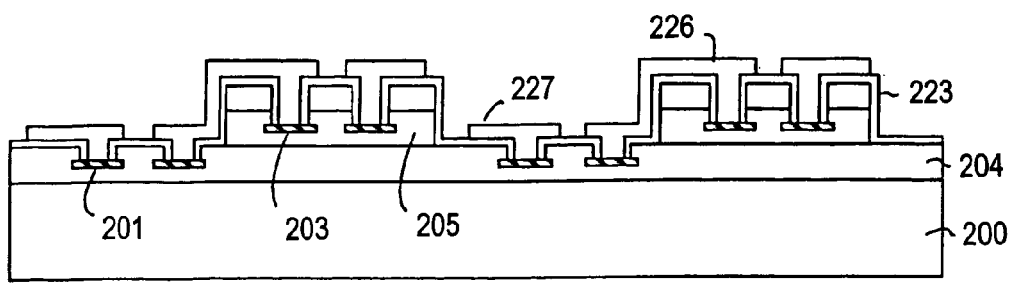

Another example is shown in FIGS. 40A–40C. Starting from FIG. 39D, with or without layer 209, contact holes 221 and 222 are formed as in FIG. 39E. Material 209 may be removed before forming contact holes 221 and 222, or may be removed after contact holes 221 and 222. Contact holes can be formed using selective etching processes and portions of contact holes 221 and 222 can be formed at the same time. For example, if thinned substrate 208 is silicon and layer 204 and material 205 are silicon dioxide, a SF6-based etch can be used to etch a portion of contact hole 222 through substrate 208 and a CF4-based etch can be used to etch the remaining portion of contact hole 222 through material 205 and the entire contact hole 221 through layer 204. In this case, the portion of contact hole 222 through material 205 may be formed at the same time as contact hole 221, as shown in FIG. 40A.

Insulating layer 223, such as a conformal glass layer deposited by a vacuum technique, is formed over the substrate and etched to yield contact holes 224 and 225 (FIG. 40B). A conductive material such as a metal is then deposited and selectively removed to form structures 226 and 227, as in FIG. 39H, where structure 226 connect contacts 201 and 202 and structures 227 act as contacts for later connection, as shown in FIG. 40C. Here structure 226 also extends over the peripheral side and through the backside of device 202.

Obviously, numerous modifications and variations of the present invention are possible in light of the above teachings. It is therefore to be understood that within the scope of the appended claims, the invention may be practiced otherwise than as specifically described herein.

What is claimed as new and desired to be protected by Letters Patent is:

1. A bonded structure, comprising:
    a semiconductor device having first and second opposing surfaces and a peripheral side surface;
    an element having third and fourth opposing surfaces;
    said first surface of said semiconductor device bonded in contact with said third surface of said element using a dielectric material without fusing;
    a first contact region disposed in said semiconductor device;
    a second contact region of said element disposed in said third surface; and
    an electrical connection between said first and second contact regions extending over said second surface and said peripheral side surface.

2. A structure as recited in claim 1, wherein:
    said semiconductor device has a smaller area than an area of said element.

3. A structure as recited in claim 1, wherein:
    said semiconductor device comprises a substrate portion;
    said peripheral side surface comprises an outer peripheral side surface of said substrate portion; and
    said second contact region is disposed in a region of said third surface outside of a portion of said third surface covered by said semiconductor device.

4. A structure as recited in claim 1, wherein said semiconductor device comprises a plurality of semiconductor elements, and a substantial portion of respective substrates in which said plurality of semiconductor elements is formed are removed.

5. A structure as recited in claim 1, comprising:
    said connection formed in contact with said peripheral side surface.

6. A structure as recited in claim 1, comprising:
    an insulative material formed on said peripheral side surface;
    a hole formed in said material exposing said second contact region; and
    a portion of said connection formed in said hole.

7. A structure as recited in claim 1, wherein said semiconductor device comprises a plurality of first semiconductor elements disposed in an insulating material.

8. A structure as recited in claim 7, wherein said insulating material comprises said peripheral side surface.

9. A structure as recited in claim 8, comprising:
said connection formed in contact with said peripheral side surface.

10. A structure as recited in claim 7, comprising:
a hole formed in said material exposing said second contact structure; and
a portion of said connection formed in said hole.

11. A structure as recited in claim 7, wherein:
one of said first semiconductor elements comprises a first contact structure formed in said first contact region; and
said connection is formed in contact with said first contact structure.

12. A structure as recited in claim 1, wherein:
said element comprises a plurality of semiconductor elements;
one of said semiconductor elements comprises a contact structure formed in said second contact region; and
said connection is formed in contact with said contact structure.

13. A structure as recited in claim 1, comprising an insulative material formed on said element, wherein:
said connection is formed in contact with said first and second contact regions and over said insulative material.

14. A structure as recited in claim 1, comprising:
a first insulative layer formed over said element; and
a first contact hole formed in said first insulative layer exposing said first contact region.

15. A structure as recited in claim 1, comprising:
a first insulative layer formed over said semiconductor device and said element;
a first hole formed in said first insulative layer over said first contact region; and
a second hole formed in said first insulative layer over said second contact region;
a second insulative layer formed in said first and second holes;
a third hole formed in said second insulative layer exposing said first contact region; and
a fourth hole formed in said second insulative layer exposing said second contact region.

16. A structure as recited in claim 1, comprising:
said device comprising a thinned substrate; and
a contact hole formed through said substrate to expose said first contact region.

17. A structure as recited in claim 16, comprising:
an insulative layer formed in said contact hole and insulating said connection from said substrate.

18. A structure as recited in claim 1, comprising:
an insulative layer formed over said semiconductor device and said element; and
holes formed in said insulative layer to expose said first contact region and said second contact region.

19. A structure as recited in claim 1, comprising:
a planarizing material formed over said device and said element;
first holes formed in said planarizing material over said first and second contact regions;
an insulative layer formed over said planarizing material;
second holes formed in said insulative layer to expose said first and second contact regions.

20. A structure as recited in claim 1, wherein said semiconductor device comprises a semiconductor element formed in a substrate, a substantial portion of said substrate being removed.

21. A structure as recited in claim 1, wherein:
said semiconductor device comprises a device region disposed on a substrate region; and
said substrate region comprises said second surface.

22. A structure as recited in claim 1, wherein:
said semiconductor device comprises a device region disposed in a substrate; and
said first surface comprises said device region.

23. A structure as recited in claim 1, wherein:
said connection is disposed interior to an outer edge of said element.

24. A structure as recited in claim 1, comprising:
said contact region located below said first surface; and
a contact hole formed in said semiconductor device and exposed to said contact region.

25. A structure as recited in claim 1, wherein:
said semiconductor device comprises a device region disposed on a substrate region;
said device region comprises said first surface; and
said substrate region comprises a contact hole exposed to said first contact region.

26. A structure as recited in claim 1, wherein:
said first surface comprises said dielectric material; and
said dielectric material is bonded in contact with said element.

27. A bonded structure, comprising:
a semiconductor device having first and second opposing surfaces and a peripheral side surface;
an element having third and fourth opposing surfaces;
said first surface of said semiconductor device bonded to in contact with said third surface of said element without fusing;
a first contact region disposed in said semiconductor device;
a second contact region of said element disposed in said third surface; and
an electrical connection between said first and second contact regions extending over said second surface and said peripheral side surface;
wherein said semiconductor device comprises a plurality of first semiconductor elements disposed in an insulating material.

28. A structure as recited in claim 27, wherein said insulating material comprises said peripheral side surface.

29. A structure as recited in claim 28, comprising:
said connection formed in contact with said peripheral side surface.

30. A structure as recited in claim 27, comprising:
a hole formed in said material exposing said second contact region; and
a portion of said connection formed in said hole.

31. A structure as recited in claim 27, wherein:
one of said first semiconductor elements comprises a first contact structure formed in said first contact region; and
said connection is formed in contact with said first contact structure.

32. A bonded structure, comprising:
a semiconductor device having a device region with at least one semiconductor device element and at least one first contact structure, a substrate region on which said device region is disposed, and a peripheral side surface;
an element having a second contact structure;

a first surface of said device region bonded in contact with a second surface of said element without fusing; and an electrical connection between said first and second contact structures extending over said substrate region and said peripheral side surface.

33. A structure as recited in claim 32, comprising:

said first contact structure located below a surface of said semiconductor device; and a contact hole formed in said semiconductor device and exposed to said first contact structure.

34. A structure as recited in claim 33, wherein:

said contact hole is formed in said substrate region.

35. A structure as recited in claim 32, wherein:

one of said first and second surfaces comprises a dielectric material.

36. A bonded structure, comprising:

a semiconductor device having first and second opposing surfaces and a peripheral side surface;

an element having third and fourth opposing surfaces;

said first surface of said semiconductor device bonded in contact with said third surface of said element without fusing;

a first contact region disposed in said semiconductor device;

a second contact region of said element disposed in said third surface;

an electrical connection between said first and second contact regions extending over said second surface and said peripheral side surface;

a planarizing material formed over said device and said element;

first holes formed in said planarizing material over said first and second contact regions;

an insulative layer formed over said planarizing material; and second holes formed in said insulative layer to expose said first and second contact regions.

37. A bonded structure, comprising:

a semiconductor device having a first contact structure formed in a substrate and a peripheral side surface;

a silicon oxide bonding layer disposed on said semiconductor device;

an element having a second contact structure; said bonding layer bonded in contact with said element without fusing; and an electrical connection between said first and second contact structures extending over said peripheral side surface.

38. A structure as recited in claim 37, comprising:

a contact hole formed in said substrate and exposing said first contact structure;

said electrical connection formed in said contact hole.

39. A structure as recited in claim 38, comprising:

an insulative material formed in said contact hole.

40. A structure as recited in claim 37, wherein:

a semiconductor device comprises a substrate from which a substantial portion has been removed.

41. A structure as recited in claim 37, wherein:

said bonding layer comprises a deposited oxide material.

42. A structure as recited in claim 37, wherein said semiconductor device comprises a plurality of first semiconductor elements disposed in an insulating material.

43. A structure as recited in claim 1, wherein said dielectric material is comprised of a silicon oxide material.

44. A structure as recited in claim 32, wherein said first surface of said device region is directly bonded to said element.

45. A structure as recited in claim 32, comprising:

a bonding layer disposed on said first surface of said device region, wherein said first surface of said device region is directly bonded to said element through said bonding layer.

46. A structure as recited in claim 45, where said bonding layer is comprised of a silicon oxide material.

47. A structure as recited in claim 1, comprising:

said first surface of said semiconductor device covalently bonded in contact with said third surface of said element at room temperature.

48. A structure as recited in claim 1, comprising:

said first surface of said semiconductor device covalently bonded in contact with said third surface of said element without use of applied pressure, voltage or heating.

49. A structure as recited in claim 27, comprising:

said first surface of said semiconductor device covalently bonded in contact with said third surface of said element at about room temperature.

50. A structure as recited in claim 27, comprising:

said first surface of said semiconductor device covalently bonded in contact with said third surface of said element without use of applied pressure, voltage or heating.

51. A structure as recited in claim 32, comprising:

said first surface of said device region covalently bonded in contact with said second surface of said element at about room temperature.

52. A structure as recited in claim 32, comprising:

said first surface of said device region covalently bonded in contact with said second surface of said element without use of applied pressure, voltage or heating.

53. A structure as recited in claim 36, comprising:

said first surface of said semiconductor device covalently bonded in contact with said third surface of said element at about room temperature.

54. A structure as recited in claim 36, comprising:

said first surface of said semiconductor device covalently bonded in contact with said third surface of said element without use of applied pressure, voltage or heating.

55. A structure as recited in claim 37, comprising:

said bonding layer covalently bonded in contact with said element at about room temperature.

56. A structure as recited in claim 37, comprising:

said bonding layer covalently bonded in contact with said element without use of applied pressure, voltage or heating.

* * * * *

UNITED STATES PATENT AND TRADEMARK OFFICE
CERTIFICATE OF CORRECTION

PATENT NO. : 7,126,212 B2  Page 1 of 1
APPLICATION NO. : 10/011432
DATED : October 24, 2006
INVENTOR(S) : Paul M. Enquist et al.

It is certified that error appears in the above-identified patent and that said Letters Patent is hereby corrected as shown below:

Column 20, line 41, change "10 im" to --10 μm--.

Column 21, line 48, change "20" to --205--.

Column 24, line 34, claim 27 delete "to".

Signed and Sealed this

Second Day of December, 2008

JON W. DUDAS
*Director of the United States Patent and Trademark Office*

UNITED STATES PATENT AND TRADEMARK OFFICE
CERTIFICATE OF CORRECTION

PATENT NO. : 7,126,212 B2  
APPLICATION NO. : 10/011432  
DATED : October 24, 2006  
INVENTOR(S) : Enquist et al.

Page 1 of 1

It is certified that error appears in the above-identified patent and that said Letters Patent is hereby corrected as shown below:

On Title page 1, in item (63) under the heading "Related U.S. Application Data," should read:

(63) Continuation-in-part of application No. 09/532,886, filed on Mar. 22, 2000, now Pat. No. 6,500,694, and is a continuation-in-part of application No. 09/410,054 filed on Oct. 1, 1999, now Pat. No. 6,984, 571.

In the Specification

Column 1, beginning at line 5, after the Title, should read:

This application is a continuation-in-part of application Ser. No. 09/532,886, filed on Mar. 22, 2000 and of application Ser. No. 09/410,054, filed on Oct. 1, 1999.

Signed and Sealed this  
Seventh Day of June, 2016

Michelle K. Lee  
*Director of the United States Patent and Trademark Office*